(12) United States Patent
Yamashita et al.

(10) Patent No.: US 10,134,331 B2
(45) Date of Patent: Nov. 20, 2018

(54) DISPLAY DEVICE

(71) Applicant: Sony Corporation, Tokyo (JP)

(72) Inventors: Junichi Yamashita, Tokyo (JP); Katsuhide Uchino, Kanagawa (JP)

(73) Assignee: Sony Corporation, Tokyo (JP)

( * ) Notice: Subject to any disclaimer, the term of this patent is extended or adjusted under 35 U.S.C. 154(b) by 372 days.

(21) Appl. No.: 14/338,490

(22) Filed: Jul. 23, 2014

(65) Prior Publication Data
US 2015/0015565 A1 Jan. 15, 2015

Related U.S. Application Data

(63) Continuation of application No. 12/075,199, filed on Mar. 10, 2008, now Pat. No. 8,823,608.

(30) Foreign Application Priority Data

Mar. 20, 2007 (JP) .................................. 2007-072966

(51) Int. Cl.
  *G09G 3/3233* (2016.01)
  *G09G 3/3266* (2016.01)
  *H01L 27/12* (2006.01)

(52) U.S. Cl.
  CPC ......... *G09G 3/3233* (2013.01); *G09G 3/3266* (2013.01); *G09G 2300/043* (2013.01);
  (Continued)

(58) Field of Classification Search
  CPC ............... G09G 3/3233; G09G 3/3266; G09G 2320/0693; G09G 2320/043;
  (Continued)

(56) References Cited

U.S. PATENT DOCUMENTS

| | | |
|---|---|---|
| 6,246,387 B1 | 6/2001 | Yamazaki |
| 6,388,386 B1 | 5/2002 | Kunii et al. |
| 6,674,471 B1 * | 1/2004 | Masuyama ....... H01L 27/14609 257/223 |
| 7,042,162 B2 * | 5/2006 | Yamazaki ............ G09G 3/3233 315/169.1 |

(Continued)

FOREIGN PATENT DOCUMENTS

| | | |
|---|---|---|
| JP | 11-271731 | 10/1999 |
| JP | 2003-173154 A | 6/2003 |

(Continued)

*Primary Examiner* — Patrick Edouard
*Assistant Examiner* — Joseph Fox
(74) *Attorney, Agent, or Firm* — Michael Best & Friedrich LLP

(57) ABSTRACT

A display device includes: a pixel array unit with pixel circuits disposed in matrix form, the pixel circuit including a driving transistor, an electro-optic element, a storage capacitor, and a sampling transistor, with the electro-optic element emitting light by generating a driving current based on information stored in the storage capacitor at the driving transistor to be applied to the electro-optic element; and a control unit, of which the output stage includes a buffer transistor, to output a pulse signal for driving the pixel array unit from the buffer transistor; wherein the pixel array unit and the control unit are formed with long laser beam irradiation to be scanned in the vertical direction or horizontal direction; and wherein with the control unit, the size of the buffer transistor is equal to or greater than the pixel pitch in the scanning direction of the laser beam.

21 Claims, 21 Drawing Sheets

(52) U.S. Cl.
CPC ........... *G09G 2300/0417* (2013.01); *G09G 2300/0819* (2013.01); *G09G 2300/0842* (2013.01); *G09G 2300/0861* (2013.01); *G09G 2300/0866* (2013.01); *G09G 2310/0256* (2013.01); *G09G 2320/0223* (2013.01); *G09G 2320/043* (2013.01); *G09G 2320/0693* (2013.01); *H01L 27/1285* (2013.01)

(58) Field of Classification Search
CPC ..... G09G 2300/0842; G09G 2300/043; G09G 2310/0256; G09G 2300/0866; G09G 2320/0223; G09G 2300/0819; G09G 2300/0417; H01L 27/1285
See application file for complete search history.

(56) References Cited

U.S. PATENT DOCUMENTS

| | | |
|---|---|---|
| 2002/0158828 A1 | 10/2002 | Isami et al. |
| 2004/0100304 A1* | 5/2004 | Kawase ............... G09G 3/3225 326/86 |
| 2006/0103423 A1 | 5/2006 | Tanishima |
| 2006/0170628 A1 | 8/2006 | Yamashita et al. |

FOREIGN PATENT DOCUMENTS

| | | |
|---|---|---|
| JP | 2003-264059 A | 9/2003 |
| JP | 2003-308052 A | 10/2003 |
| JP | 2004-047989 A | 2/2004 |
| JP | 2004-126513 A | 4/2004 |
| JP | 2006-215213 | 8/2006 |
| JP | 2006-308768 A | 11/2006 |

\* cited by examiner

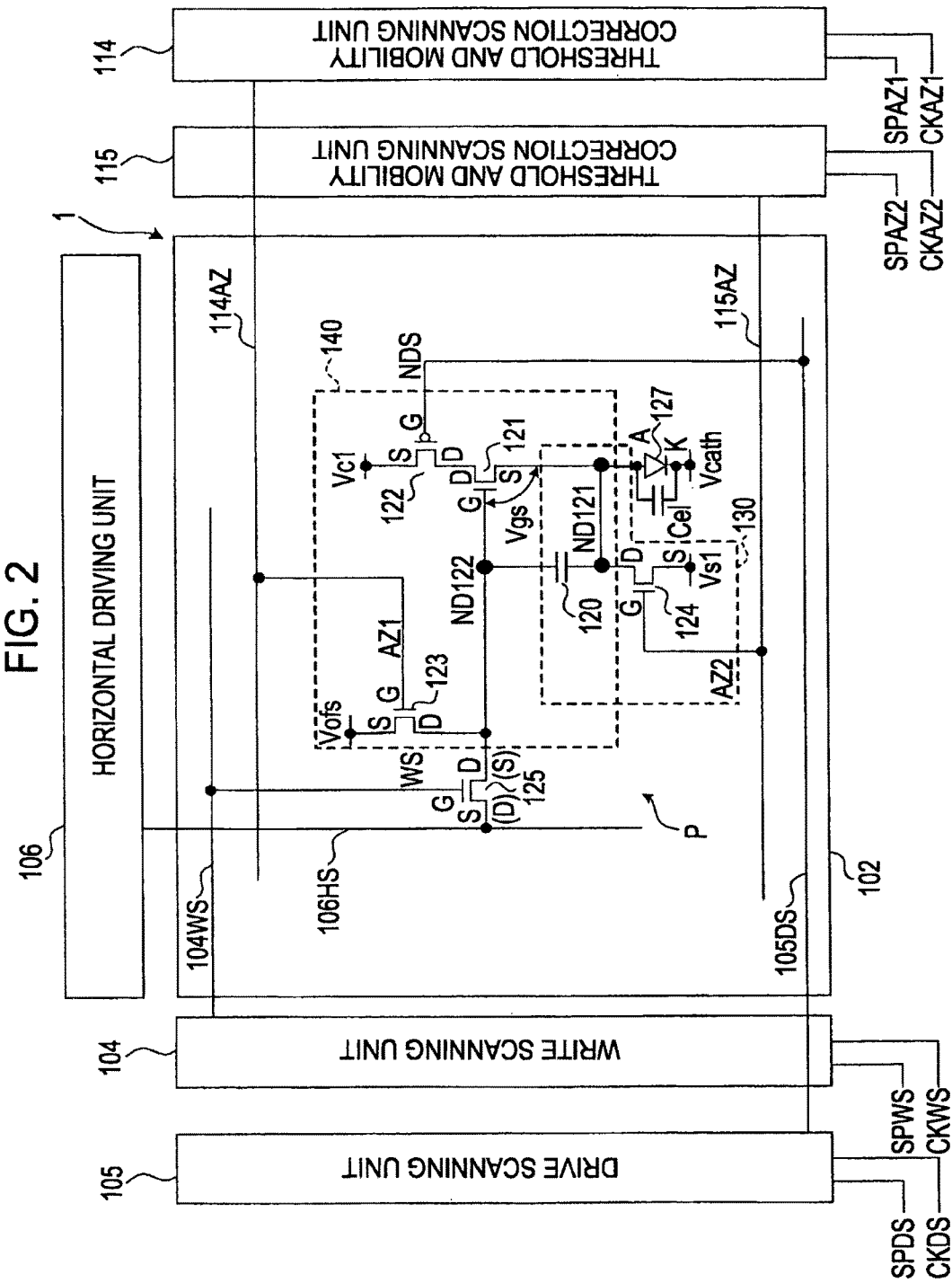

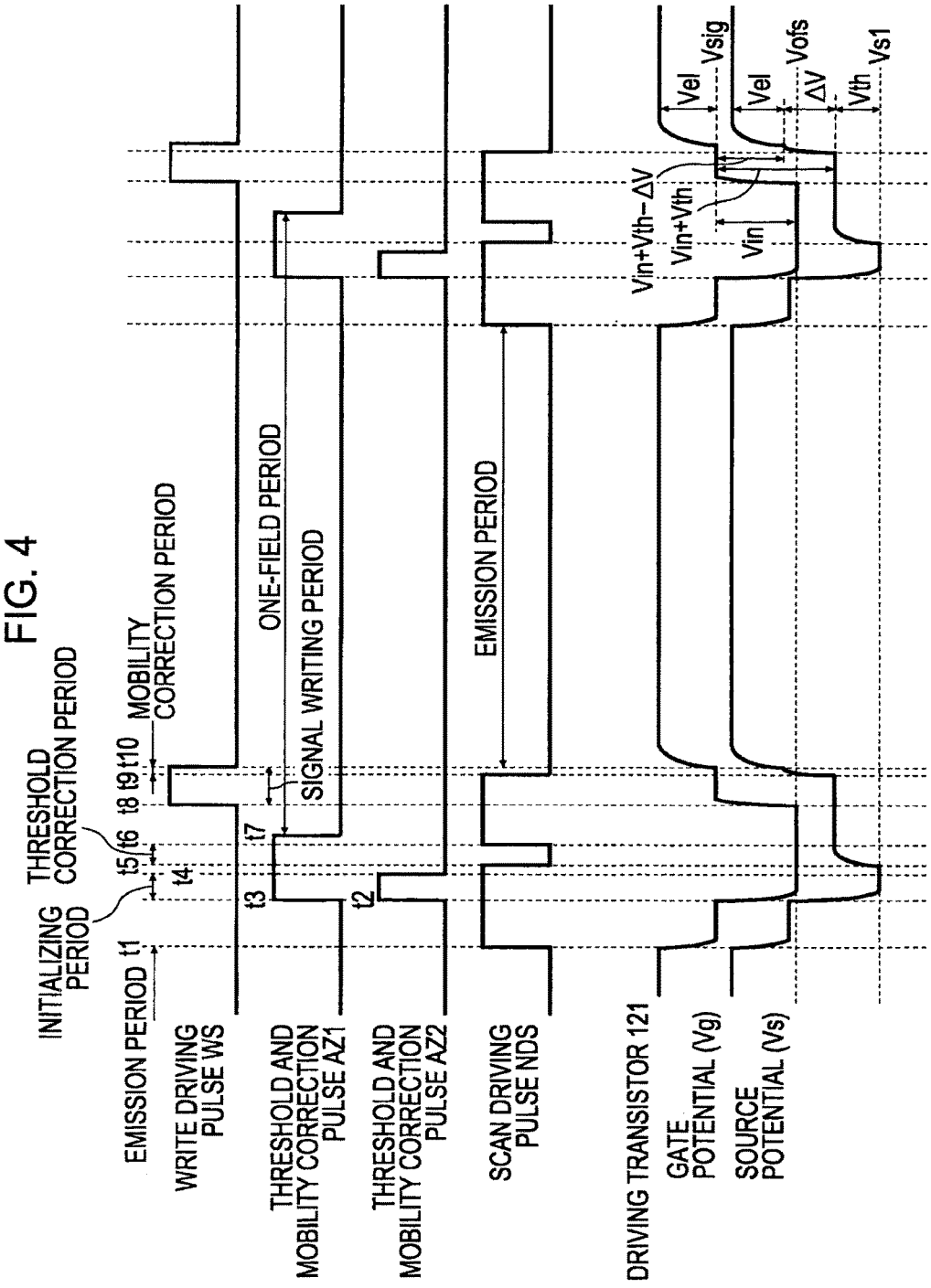

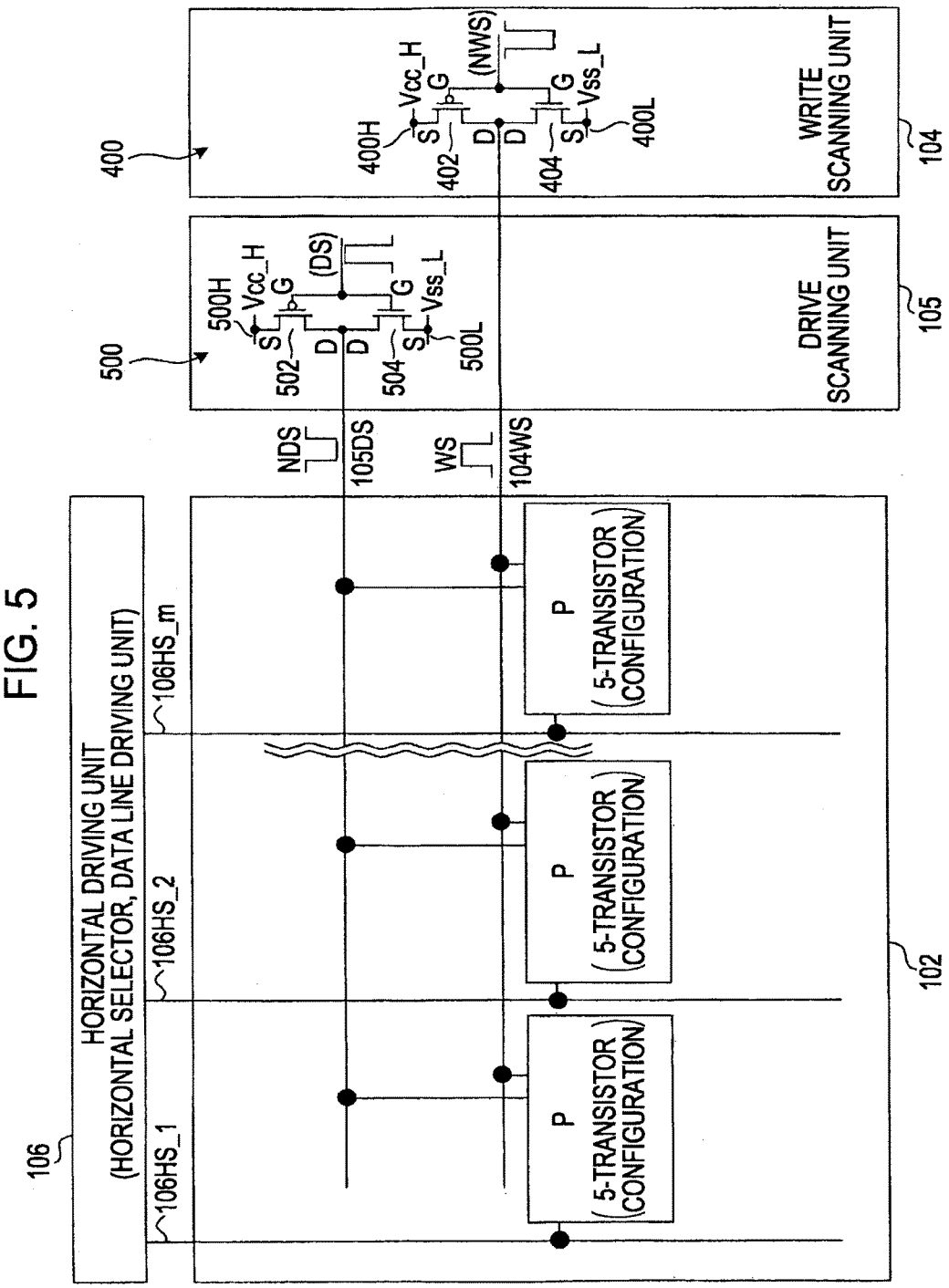

DISPLAY DEVICE

CROSS REFERENCES TO RELATED APPLICATIONS

The present application is a Continuation Application of U.S. patent application Ser. No. 12/075,199, filed Mar. 10, 2008 and contains subject matter related to Japanese Patent Application JP 2007-072966 filed in the Japanese Patent Office on Mar. 20, 2007, the entire contents of which are incorporated herein by reference.

BACKGROUND OF THE INVENTION

1. Field of the Invention

The present invention relates to a display device including a pixel array unit where pixel circuits (also referred to as pixels) including an electro-optic element (also referred to as a display element or light-emitting element) are arrayed in a matrix form. More particularly, the present invention relates to an active-matrix display device wherein pixel circuits including an electro-optic element of which the brightness changes depending on the magnitude of a driving signal as a display element are disposed in a matrix form, each pixel circuit has an active element, and display driving is performed in increments of pixel by the active element thereof.

2. Description of the Related Art

As for pixel display elements, there has been a display device employing an electro-optic element of which the brightness changes due to voltage applied thereto or current flowing thereto. For example, as an electro-optic element of which the brightness changes due to voltage applied thereto a liquid crystal display element is a representative example, and as an electro-optic element of which the brightness changes due to current flowing thereto an organic electro luminescence (organic EL, organic light emitting diode (OLED); hereafter, referred to as an organic EL) element is a representative example. An organic EL display device employing an organic EL element which is the latter is a so-called light-emitting display device employing an electro-optic element which is a self-light-emitting element as a pixel display element.

An organic EL element is an electro-optic element employing a phenomenon wherein upon an electric field being applied to an organic thin film, light is emitted. An organic EL element can be driven even with relatively low applied voltage (e.g., at or above 10 V), so can be driven with low consumption power. Also, an organic EL element is a self-light-emitting element which emits light by itself, so with a liquid crystal display device, there is no need to provide an auxiliary lighting member such as a backlight or the like necessary for a liquid crystal device, and accordingly, reduction in weight and reduction in thickness can be readily performed. Further, the response speed of an organic EL element is very high speed (e.g., around several microsecond), so afterimages at the time of moving image display do not occur. According to such advantages, development of flat-self-light-emitting display devices employing an organic EL element as an electro-optic element has been performed in recent years.

With current-driven electro-optic elements including an organic EL element as a representative example, when their driving current values differ, their light-emitting brightness also differs. Accordingly, in order to emit light with stable brightness, it is important to supply a stable driving current to an electro-optic element. For example, a drive system for supplying a driving current to an organic EL element can be divided into a constant current drive system and a constant voltage drive system (no known literature is presented here since this is a well-known technique).

The voltage-current properties of an organic EL element include a property with great inclination, so upon constant voltage driving being performed, minute voltage irregularities or minute element property irregularities cause great brightness irregularities. Thus, in general, constant current driving is employed, which uses a driving transistor at a saturation area. It goes without saying that with constant current driving also, current fluctuation causes brightness irregularities, but small current irregularities cause small brightness irregularities.

Conversely, even with the constant current drive system, in order not to change the light-emitting brightness of an electro-optic element, it is important to steady a driving signal written in and held in a storage capacitor according to an input image signal. For example, in order not to change the light-emitting brightness of an organic EL element, it is important to steady a driving current according to an input image signal.

Note however, the threshold voltage and mobility of an active element (driving transistor) for driving an electro-optic element fluctuates due to process fluctuation. Also, the property of an electro-optic element such as an organic EL element or the like fluctuates with time. Particularly, in the case of employing a low-temperature-polysilicon TFT substrate or the like, the irregularities of the threshold property and mobility property of a transistor are great. Even with the constant drive system, the property irregularities of such a driving active element or the property fluctuation of an electro-optic element affects light-emitting brightness.

Therefore, in order to control light-emitting brightness across the entire screen of a display device evenly, various types of arrangement have been studied to control light-emitting fluctuation due to the property fluctuation of the above-mentioned driving active element or electro-optic element (see Japanese Unexamined Patent Application Publication No. 2006-215213).

For example, with the arrangement described in Japanese Unexamined Patent Application Publication No. 2006-215213, as a pixel circuit for organic EL elements, there have been proposed a threshold correction function to steady a driving current even in the case of the threshold voltage of a driving transistor having irregularities or change over time, a mobility correction function to steady a driving current even in the case of the mobility of a driving transistor having irregularities or change over time, and a bootstrap function to steady a driving current even in the case of the current-voltage property of an organic EL element having change over time.

In order to realize these threshold correction function and mobility correction function and so forth, it is necessary to turn on/off a sampling transistor or each transistor added for threshold correction or mobility correction at a predetermined timing using a pulse signal.

The ON period or OFF period of each transistor determines each correction period, so it is important to manage timing for turning on/off each transistor to receive each correction effect. Upon irregularities being caused with the correction period, the threshold correction advantage and mobility correction advantage fluctuate from one pixel to another, and brightness unevenness due to such irregularities is caused, leading to image quality deterioration. For example, there is no problem in the case of the irregularities between the correction periods with leeway, such that when the correction period is long, even if there are a few irregularities regarding ON/OFF timing, there are few problems, but the shorter the correction period becomes, the smaller the leeway as to the irregularities between the correction periods becomes, and accordingly, it is important to manage so as not to cause the irregularities thereof, and so as not to cause deviation regarding the ON/OFF timing of a transistor.

Now, a pulse signal (pulse signal for brightness change correction operation) for controlling each transistor is output for each scanning line from a scan circuit provided on the side edge of a pixel array unit where pixel circuits are arrayed in a two-dimensional form, and is supplied simultaneously for each scanning line to predetermined terminals of all the pixel circuits connected to each scanning line within the pixel array unit via each scanning line. Note however, a scanning line having linear resistance and distributed capacity (overlap parasitic capacitance), so there is concern that there may be caused difference regarding the propagation property of a pulse signal depending on whether the pixel circuit is far from or near the scan circuit, and the correction period fluctuates due to the propagation property difference thereof. Focusing attention on this point, it can be conceived to employ a technique for improving the irregularities between the correction periods from the perspective of driving timing

SUMMARY OF THE INVENTION

Note however, with improvements from the perspective of driving timing, the pulse signal itself supplied from the scan circuit for each scanning line is assumed to have no deviation of timing (specifically, blunting of a pulse waveform). If the pulse signal itself supplied from the scan circuit has waveform blunting, and the waveform blunting thereof differs for each scanning line, there are caused irregularities between the correction periods, and brightness unevenness occurs. The waveform blunting of the pulse signal itself supplied from the scan circuit affects all of the pixel circuits connected to scanning lines similarly, and accordingly, brightness unevenness due to the irregularities regarding the waveform blunting appears for each scanning line (i.e., linearly). This point is readily recognized visibly as compared with random brightness unevenness in the case of the threshold and mobility of each pixel circuit within the pixel array unit fluctuating at random, which causes a critical problem.

Also, the deviation of such pulse timing (specifically, blunting of a pulse waveform) is not restricted to threshold correction and mobility correction, and with the other pulses for driving the pixel circuits also, there is difference of the degree of leeway as to timing deviation, but if there is deviation, the influence thereof manifested in display performance is not negligible.

There has been recognized a need to provide an arrangement whereby the irregularities of the waveform blunting of the pulse signal supplied from the scan circuit can be improved.

An embodiment of a display device according to the present invention is a display device causing an electro-optic element within a pixel circuit to emit light based on a picture signal, within a pixel circuit disposed in a pixel array unit in a matrix form, there are provided at least a driving transistor configured to generate a driving current, an electro-optic element connected to the output terminal side of the driving transistor, a storage capacitor for storing information corresponding to the signal potential within a picture signal supplied via a picture signal line, and a sampling transistor configured to write information corresponding to the signal potential of the picture signal in the storage capacitor. With the pixel circuit, the electro-optic element is caused to emit light by generating a driving current based on information stored in the storage capacitor at the driving transistor to be applied to the electro-optic element. It is desirable to connect the storage capacitor between the control input terminal and output terminal of the driving transistor.

The sampling transistor writes information corresponding to the signal potential in the storage capacitor, so the sampling transistor inputs the signal potential to the input terminal thereof (one of the source terminal or drain terminal), and writes information corresponding to the signal potential in the storage capacitor connected to the output terminal thereof (the other of the source terminal or drain terminal). It goes without saying that the output terminal of the sampling transistor is also connected to the control input terminal of the driving transistor.

As features according to an embodiment of a display device according to the present invention, when the perspective of a circuit pattern is taken into consideration, first, the pixel array unit and control unit are assumed to be formed by long laser beam irradiation having a predetermined wavelength to be scanned in the vertical direction or horizontal direction.

Of the buffer transistors, buffer transistors configured to output a pulse signal for sampling an input video signal to each signal line are assumed to be employed. As the buffer transistors for outputting a pulse signal for sampling an input video signal to each signal line, for example, a buffer transistor for determining the start timing of a predetermined (certain) operation to be realized by driving a pixel circuit, and a buffer transistor for determining the end timing thereof are employed.

As a point of view, these buffer transistors can be applied to not only a scanning unit in the horizontal direction, but also a scanning unit in the vertical direction. When taking the common scan direction into consideration, and focusing attention on threshold correction and mobility correction, there is need to focus attention on not the scanning unit in the horizontal direction but the scanning unit in the vertical direction.

This is because in general, the sampling rate in the horizontal direction is several 100 nanoseconds with point sequential drive, several 10 microseconds with line sequential drive, and the sampling rate in the vertical direction is around 50 microseconds, so in order to suppress the irregularities between correction periods in the horizontal direction, irradiation is performed so as to direct the ELA irradiation direction to the longitudinal direction (row direction) of pixels. Mobility correction is performed with scanning in the vertical direction, but it takes several microseconds, so ELA irradiation irregularities exceed the level which can be disregarded, there is need to devise the scanning unit in the vertical direction using the above-mentioned layout.

Note however, with the line sequential driving, the sampling rate in the horizontal direction is longer than the mobility correction time, so ELA irradiation direction can be inverted 90 degrees in some cases. At this time, with the scanning unit in the horizontal direction also, irregularities are caused due to ELA, so it is desirable to devise the scanning unit in the horizontal direction using the above-mentioned layout.

It is desirable to set the channel width of the buffer transistor to the maximum excluding wiring portions to be connected to the respective terminals of the buffer transistor, within the pixel pitch in the scanning direction of a laser beam.

It is desirable to set each size of the buffer transistors in each row so as to be equal to or greater than the pixel pitch in the scanning direction of a laser beam, and as for the relations with an adjacent row, it is desirable to dispose portions protruding toward the adjacent row so as to be alternate. It is further desirable to set the channel of the buffer transistor so as to be greater than the pixel pitch in the scanning direction of a laser beam.

It is desirable to configure each of the buffer transistors in each row with a multi-finger configuration, and set each size of the respective transistor buffers having a multi-finger configuration so as to be equal to or greater than the pixel pitch in the scanning direction of a laser beam.

Note that it is desirable to apply such handling relating to the sizes of the buffer transistors which takes an aspect of such a circuit pattern into consideration to not all of the buffer transistors within the control unit but buffer transistors with leeway as to the property irregularities of the pulse signal. It goes without saying that this does not mean to eliminate applying such handling to all of the buffer transistors.

For example, it is desirable to apply such handling to a scanning unit for outputting a correction pulse for controlling a driving current fluctuation suppressing unit for suppressing the fluctuation of a driving current accompanying the property fluctuation of a driving transistor or electro-optic element, such as at least one of a write scanning unit and correction scanning unit relating to threshold correction or mobility correction. In particular, it is desirable to apply such handling to a unit having little leeway as to the irregularities between correction periods. For example, usually, mobility correction periods are far shorter than threshold correction periods, and the irregularities thereof appear as change in brightness, so there is a need to perform the irregularities management of mobility correction periods strictly, and accordingly, it is desirable to apply such handling to buffer transistors for correction pulse relating to mobility correction.

According to an embodiment of the present invention, an arrangement is made wherein the pixel array unit and control unit are formed with long laser beam irradiation having a predetermined wavelength to be scanned in the vertical direction, and with regard to the control unit, the sizes of buffer transistors for outputting a pulse signal for sampling an input video signal to each signal line, such as each buffer transistor for determining the start or end of an operation, are set so as to be equal to or greater than the pixel pitch in the scanning direction of a laser beam.

Thus, the property irregularities between driving pulse waveforms to be output to a pixel circuit from the buffer transistors of the control unit can be suppressed as compared with the related art. This is because the property of a transistor becomes the property corresponding to an average value of laser beam irradiation intensity, but laying out a transistor size greatly enables the number of times of laser beam irradiation as to one buffer transistor to be increased, and accordingly the irregularities can be suppressed as compared with the case of a small transistor size and few number of times of laser beam irradiation. As a result thereof, deterioration in display performance due to the property irregularities of buffer transistors can be suppressed.

BRIEF DESCRIPTION OF THE DRAWINGS

FIG. 2 is a diagram illustrating a first embodiment of a pixel circuit making up an organic EL display device;

FIG. 4 is a timing chart describing the operation of a pixel circuit according to a first embodiment;

FIG. 5 is a diagram describing a first example of the output circuits of a write scanning unit and a drive scanning unit;

DESCRIPTION OF THE PREFERRED EMBODIMENTS

Description will be made below regarding embodiments of the present invention with reference to the drawings.
<Entire Overview of Display Device>

Figure 1A:
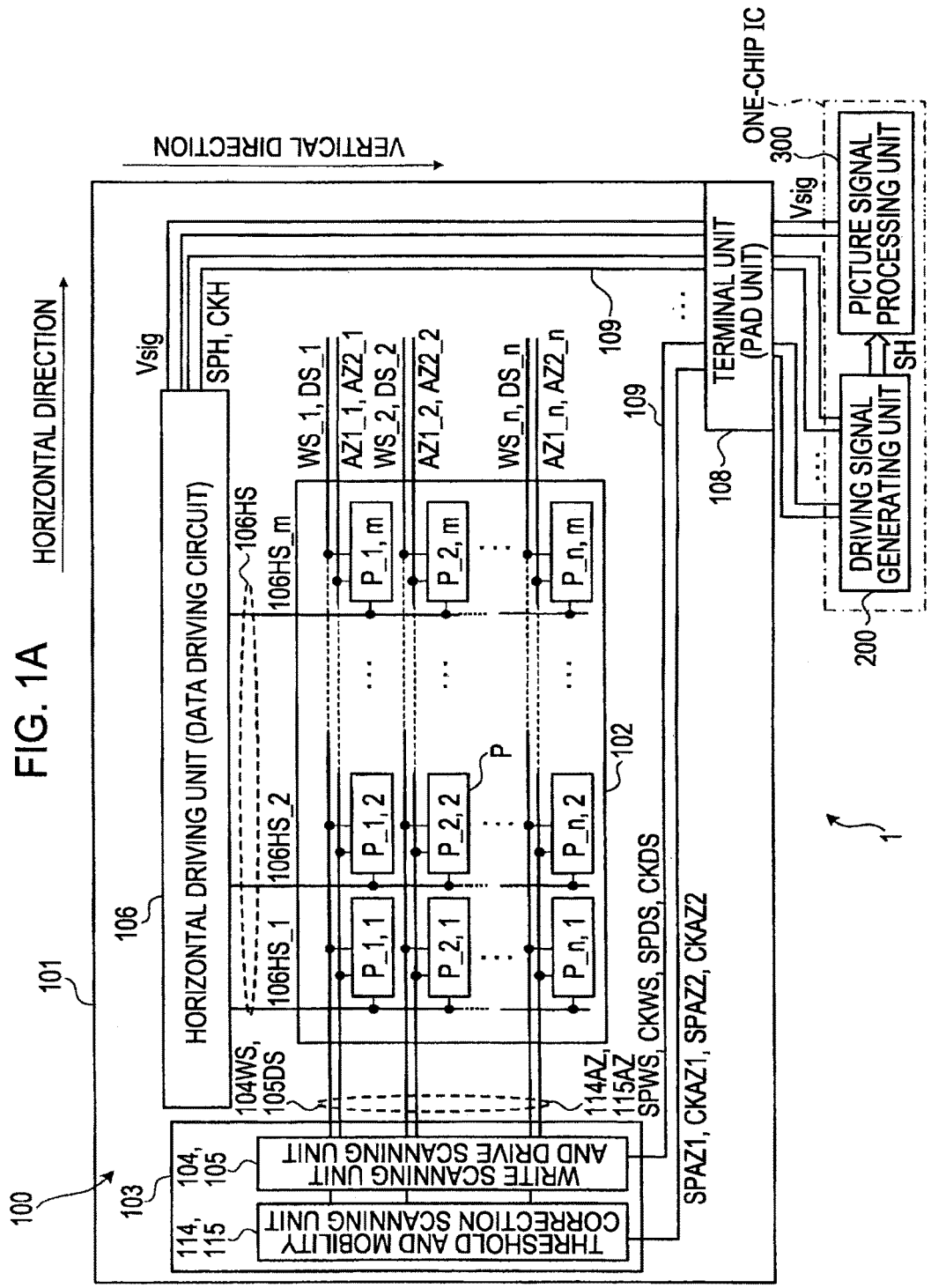
FIG. 1A is a block diagram illustrating the schematic configuration of an active-matrix display device serving as an embodiment of a display device according to the present invention.
Figure 1B:
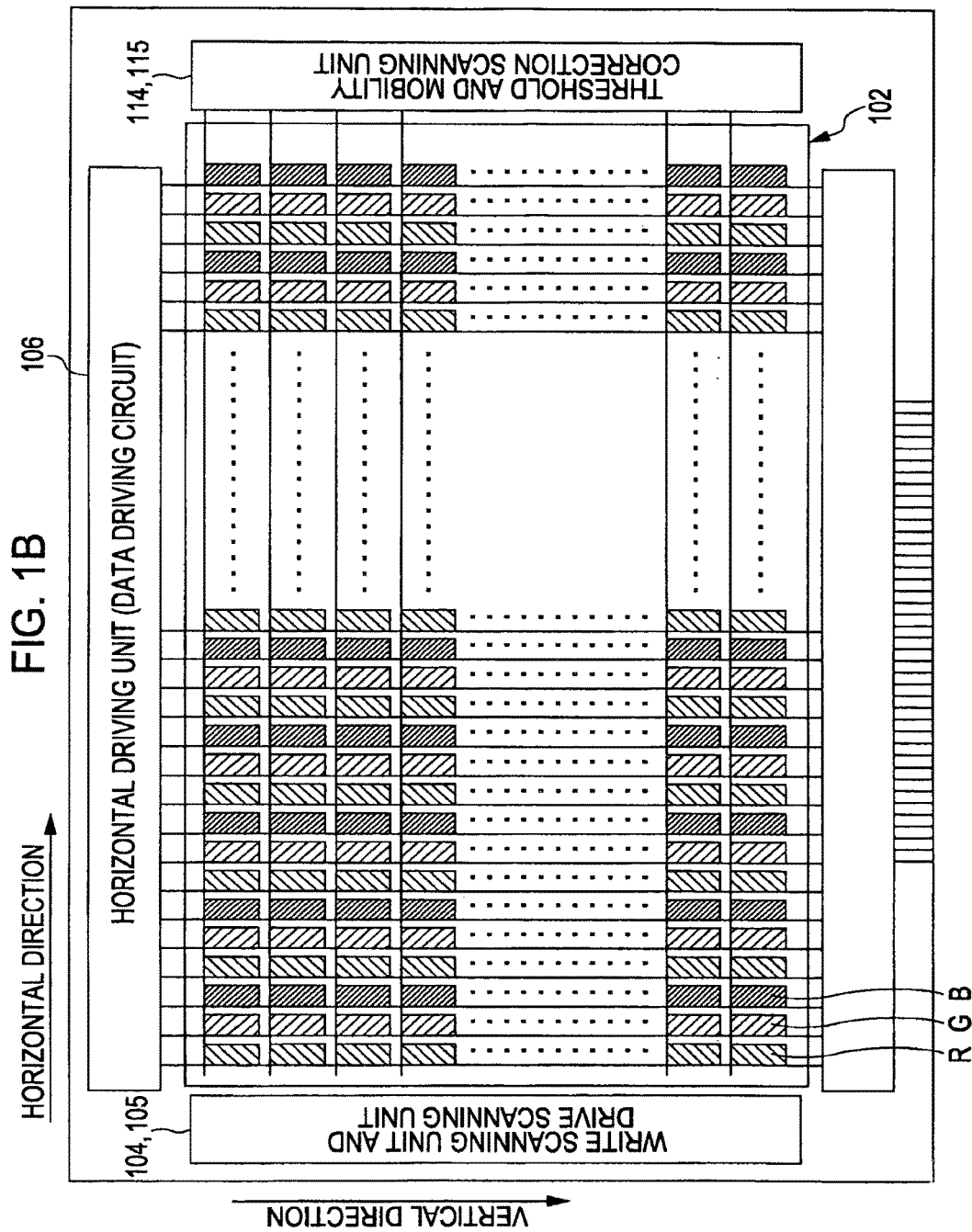
FIG. 1B is a block diagram (in the case of color display mode) illustrating the schematic configuration of an active-matrix display device serving as an embodiment of a display device according to the present invention.

FIGS. 1A and 1B are block diagrams illustrating the schematic configuration of an active matrix display device according to an embodiment of a display device according to the present invention. With the present embodiment, a case will be described as an example wherein an organic EL element as a pixel display element, and a polysilicon thin film transistor (TFT) as an active element are each employed, and the present embodiment is applied to an active matrix organic EL display (hereafter, referred to as an organic EL display device) made up of the organic EL element being formed on a semiconductor substrate where the thin film transistor are formed.

Note that description will be made specifically below with an organic EL element serving as a pixel display element as an example, and the display element to which the present embodiment is applied is not restricted to an organic EL element. In general, all of later-described embodiments can be applied to all of light-emitting elements which emit light by current drive.

As shown in FIG. 1A, an organic EL display device 1 includes a display panel unit 100 where pixel circuits (also referred to as pixels) P having an organic EL element (not shown) serving as multiple display elements are disposed so as to configure a valid picture area having an aspect ratio, which is a display aspect ratio of X:Y (e.g., 9:16), a driving signal generating unit 200 which is an example of a panel control unit for outputting various types of pulse signal for drive-controlling the display panel unit 200, and a picture signal processing unit 300. The driving signal generating unit 200 and picture signal processing unit 300 are built in a one-chip IC (Integral Circuit).

Note that as shown in the drawing, the product type is not restricted to being provided as the organic EL display device 1 which is a module (compound component) type including all of the display panel unit 100, driving signal generating unit 200, and picture signal processing unit 300, and rather can be provided as the organic EL display device 1 including the display panel unit 100 alone, for example. Also, such an organic EL display device 1 is employed as the display unit of a portable music player employing a recording medium such as semiconductor memory, mini disc (MD), cassette tape, or the like, and the display unit of the other electronic equipment.

With the display panel unit 100, a pixel array unit 102 where pixel circuits P are arrayed in a matrix form of n rows×m columns, a vertical driving unit 103 for scanning the pixel circuits P in the vertical direction, a horizontal driving unit (also referred to as a horizontal selector, or data line driving unit) 106 for scanning the pixel circuits P in the horizontal direction, and an external connection terminal unit (pad unit) 108 are formed on the substrate 101 in an integrated manner. That is to say, an arrangement is made wherein peripheral driving circuits such as the vertical driving unit 103, horizontal driving unit 106, and so forth are formed on the same substrate 101 as the pixel array unit 102.

The vertical driving unit 103 includes a buffer transistor at the output stage, which is an example of a control unit for outputting a pulse signal for driving each pixel circuit P of the pixel array unit 102 from the buffer transistor. The vertical driving unit 103 includes, for example, a write scanning unit (write scanner WS) 104, a drive scanning unit (drive scanner DS) 105 (both are shown integrally in the drawing), and two threshold and mobility correction scanning units 114 and 115 (both are shown integrally in the drawing).

The pixel array unit 102 is, as an example, configured to be driven by the write scanning unit 104, drive scanning unit 105, and threshold and mobility correction scan units 114 and 115 from one side of the shown left and right directions or both sides, and also driven by the horizontal driving unit 106 from one side of the shown upper and lower directions or both sides. The terminal unit 108 is configured to be supplied with various types of pulse signal from the driving signal generating unit 200. Also, similarly, the terminal unit 108 is configured to be supplied with a picture signal Vsig from the picture signal processing unit 300.

As an example, necessary pulse signals are supplied as vertical driving pulse signals, such as shift start pulses SPDS and SPWS which are an example of a write start pulse in the vertical direction, vertical scan clocks CKDS and CKWS, and so forth. Also, necessary pulse signals are supplied as pulse signals for correcting a threshold or mobility, such as shift start pulses SPAZ1 and SPAZ2 which are an example of a threshold detection start pulse in the vertical direction, vertical scan clocks CKAZ1 and CKAZ2, and so forth. Also, necessary pulse signals are supplied as horizontal driving pulse signals, such as horizontal start pulse SPH and SPWS which is an example of a write start pulse in the horizontal direction, horizontal scan clock CKH, and so forth.

Each terminal of the terminal unit 108 is configured to be connected to the vertical driving unit 103 and horizontal driving unit 106 via a wiring 109. For example, each pulse supplied to the terminal unit 108 is supplied to each unit of the vertical driving unit 103 and the horizontal driving unit 106 via a buffer following the voltage level of each pulse being internally adjusted at an unshown level shifter unit as necessary.

With the pixel array unit 102, though not shown in the drawing (details will be described later), an arrangement is made wherein the pixel circuits P where a pixel transistor is provided as to an organic EL element serving as a display element are two-dimensionally disposed in a matrix form, a scanning line is wired for each row as to the pixel array thereof, and also a signal line is wired for each column.

For example, the pixel array unit 102 is formed with scanning lines (gate lines) 104WS and 105DS, threshold and mobility correction scanning lines 114AZ and 115AZ, and a signal line (data line) 106HS. An unshown organic EL element, and a thin film transistor (TFT) for driving this element are formed at the crossing portion of both. The pixel circuit P is configured of a combination of the organic EL element and thin film transistor.

Specifically, n rows worth of write scanning lines 104WS_1 through 104WS_n driven with a write driving pulse WS by the write scanning unit 104, n rows worth of drive scanning lines 105DS_1 through 105DS_n driven with a scan driving pulse NDS by the drive scanning unit 105, n rows worth of threshold and mobility correction scanning lines 114AZ_1 through 114AZ_n driven with a threshold and mobility correction pulse AZ1 by the first threshold and mobility correction scanning unit 114, and n rows worth of threshold and mobility correction scanning lines 115AZ_1 through 115AZ_n driven with a threshold and mobility correction pulse AZ2 by the second threshold and mobility correction scanning unit 115 are wired to each pixel circuit P arrayed in a matrix form for each pixel row.

The write scanning unit 104 and drive scanning unit 105 sequentially select each of the pixel circuits P via each of the scanning lines 105DS and 104WS based on the pulse signal of the vertical driving system supplied from the driving signal generating unit 200. The horizontal driving unit 106 writes an image signal in the selected pixel circuit P via the picture signal line 106HS based on the pulse signal of the horizontal driving system supplied from the driving signal generating unit 200.

Each unit of the vertical driving unit 103 scans the pixel array unit 102 in order of lines, and also in sync with this, the horizontal driving unit 106 writes one horizontal line worth of an image signal in order in the horizontal direction (i.e., for each pixel), or one horizontal line worth of an image signal simultaneously in the pixel array unit 102. The former is point sequence drive as a whole, and the latter is line sequence drive as a whole.

In the case of corresponding to the point sequential drive, the horizontal driving unit 106 is configured of a shift register, a sampling switch (horizontal switch), and so forth, and writes the pixel signal input from the picture signal processing unit 300 in each of the pixel circuits P of the row selected by each unit of the vertical driving unit 103 in increments of pixel. That is to say, the horizontal driving unit 106 performs the point sequential drive for writing a picture signal in each of the pixel circuits P of the selected row by vertical scanning in increments of pixel.

On the other hand, in the case of corresponding to the line sequential drive, the horizontal driving unit 106 is configured so as to include a driver circuit for simultaneously turning on unshown switches provided on the picture signal line 106HS of all columns, and simultaneously turns on the unshown switches provided on the picture signal line 106HS of all columns to simultaneously write the pixel signal input from the picture signal processing unit 300 in one row worth of all the pixel circuits P of the row selected by the vertical driving unit 103.

Each unit of the vertical driving unit 103 is configured of a combination of logic gates (including latch), and selects each of the pixel circuits P of the pixel array unit 102 in increments of row. Note that in FIG. 1A, an arrangement is shown wherein the vertical driving unit 103 is disposed only at one side of the pixel array unit 102, but an arrangement may be employed wherein the vertical driving unit 103 is disposed at both sides so as to sandwich the pixel array unit 102.

Similarly, in FIG. 1A, an arrangement is shown wherein the horizontal driving unit 106 is disposed only at one side of the pixel array unit 102, but an arrangement may be employed wherein the horizontal driving unit 106 is disposed at both sides so as to sandwich the pixel array unit 102.

Note that in order to correspond to color image display, with the pixel array unit 102, as shown in FIG. 1B for example, sub pixels G, R, and B wherein one pixel has charge of any of red, green, and blue are arrayed in a stripe form.

Pixel Circuit: First Embodiment

FIG. 2 is a diagram illustrating a first embodiment of the pixel circuits P making up the organic EL display device 1 shown in FIGS. 1A and 1B. Note that FIG. 2 also illustrates the vertical driving unit 103 and horizontal driving unit 106 provided on the peripheral portion of the pixel circuits P on the substrate 101 of the display panel unit 100.

Figure 3A:
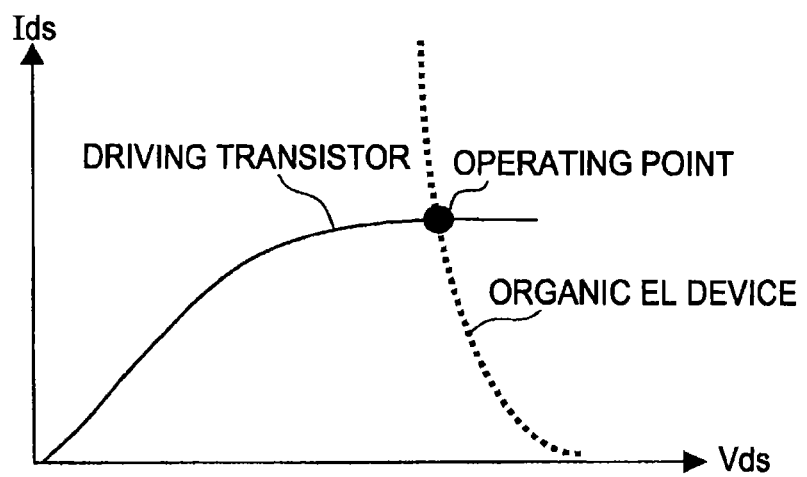
FIG. 3A is a diagram describing operating points of an organic EL device and a driving transistor.
Figure 3B:
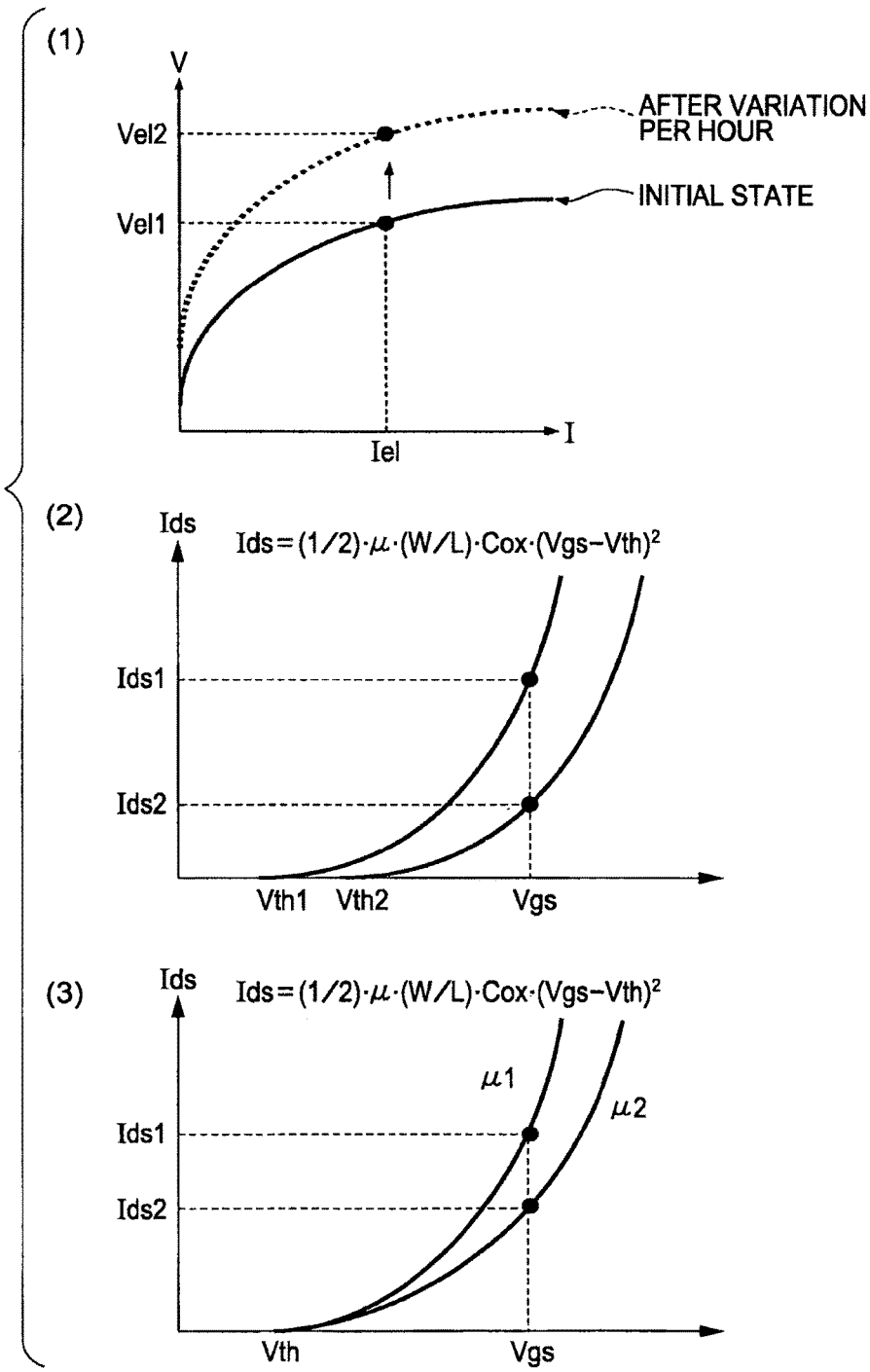
FIG. 3B is a diagram describing influence of the property irregularities of an organic EL device and a driving transistor on a driving current.
Figure 3C:
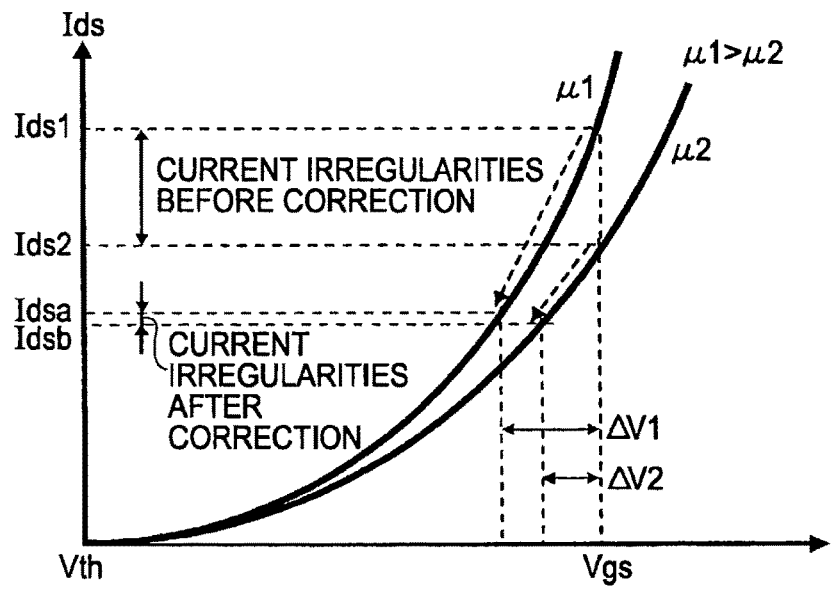
FIG. 3C is a diagram (Part 1) describing the concept of a technique for improving influence of the property irregularities of an organic EL device and a driving transistor on a driving current.
Figure 3D:
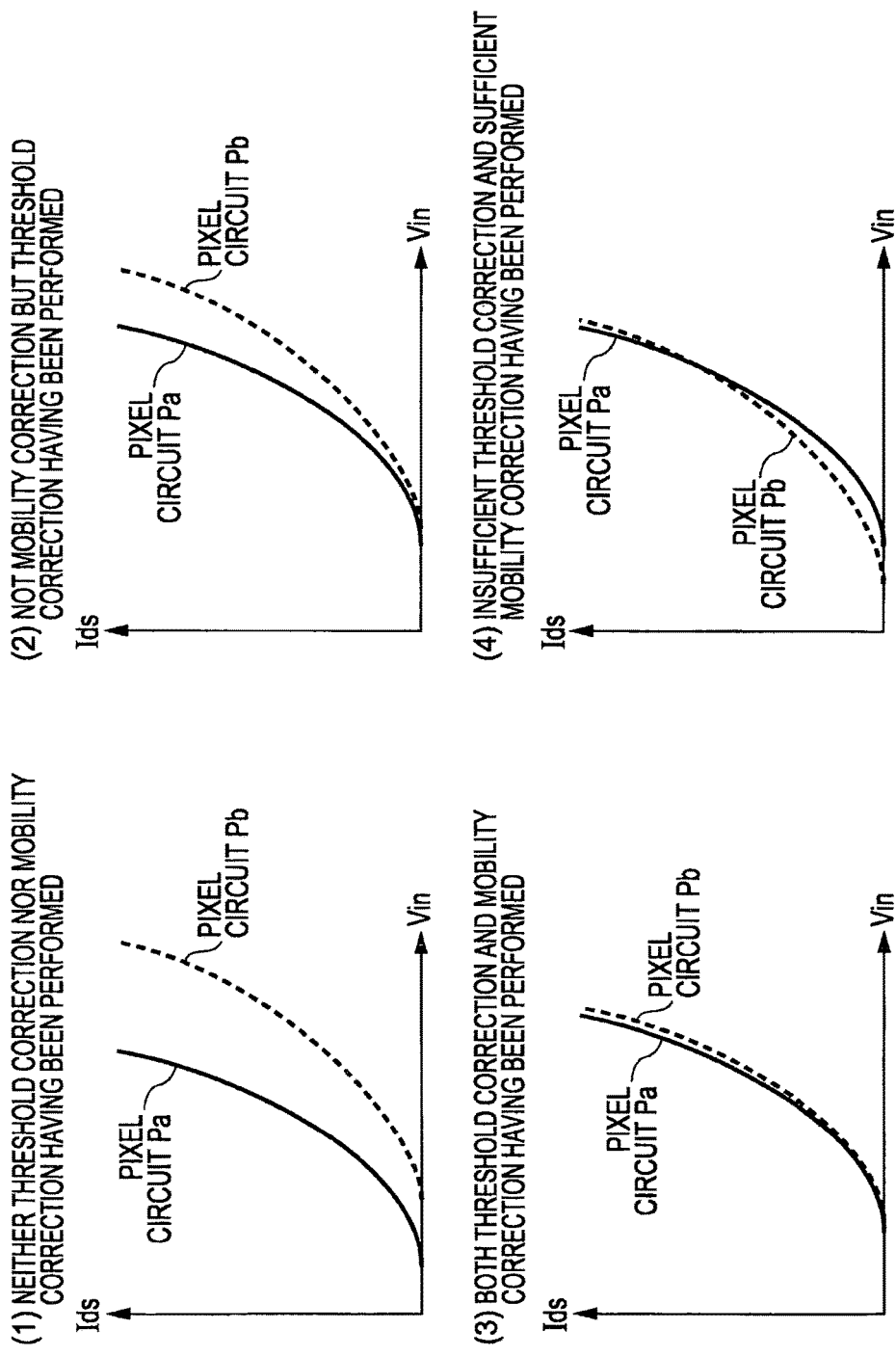
FIG. 3D is a diagram (Part 1) describing the concept of the technique for improving influence of the property irregularities of an organic EL device and a driving transistor on a driving current.

FIG. 3A is a diagram describing the operating points of the organic EL element and driving transistor. FIG. 3B is a diagram describing influence due to the property irregularities of the organic EL device and driving transistor given to a driving current Ids. FIG. 3C and FIG. 3D are diagrams describing the concept of improvement technique thereof.

The pixel circuits P according to the first embodiment shown in FIG. 2 have features in that a driving transistor is basically configured of an n-channel type thin film field-effect transistor, and also in that there are provided a circuit for suppressing fluctuation of the driving current Ids to the organic EL element due to deterioration over time of the organic EL element, i.e., a driving signal stabilizing circuit (Part 1) for realizing a threshold correction function and a mobility correction function for correcting change in current-voltage property of the organic EL element which is an example of an electro-optic element to maintain the driving current Ids constant uniformly. Additionally, there are features in that there is provided a driving signal stabilizing circuit (Part 1) for realizing a bootstrap function for stabilizing a driving current even in the case of the current-voltage property of the organic EL element having change over time.

Note that with the pixel circuits P according to the first embodiment, a p-channel type transistor is employed as a light-emitting control transistor, but such as a later-described second embodiment, an arrangement can be made wherein this is changed to a n-channel type transistor so as to drive using the active-high scan driving pulse DS. In this case, all of the switch transistors can be configured of n-channel type transistors, whereby an existing amorphous silicon (a-Si) process can be employed at the time of creating a transistor. Thus, reduction in cost of a transistor substrate can be realized. In this point, with the pixel circuits P according to the first embodiment, a p-channel type is employed as a light-emitting control transistor, which does have disadvantageous aspects.

MOS transistors are employed as the respective transistors including driving transistors. In this case, the gate terminal is taken as the control input terminal, and one of the source terminal and drain terminal is taken as the output terminal, and the other is taken as the output terminal.

The pixel circuits P include a storage capacitor (also referred to as a pixel capacitor) 120, an n-channel type driving transistor 121, a p-channel type light-emitting control transistor 122 wherein an active-low driving pulse (scan driving pulse NDS) is supplied to the gate terminal G which is the control input terminal, an n-channel type sampling transistor 125 wherein an active-high driving pulse (write driving pulse WS) is supplied to the gate terminal G which is the control input terminal, and an organic EL element 127 which is an example of an electro-optic element (light-emitting element) for emitting light by a current being applied thereto.

The sampling transistor 125 is a switching transistor provided at the gate terminal G (control input terminal) of the driving transistor 121, and the light-emitting control transistor 122 is also a switching transistor. In general, the organic EL element 127 is represented with the symbol of diode since this includes rectifier. Note that the organic EL element 127 includes a parasitic capacitor (equivalent capacitor) Cel. In the drawing, this parasitic capacitor Cel is shown in parallel with the organic EL element 127.

The pixel circuits P have features in that the light-emitting control transistor 122 is disposed at the drain terminal D side of the driving transistor 121, the storage capacitor 120 is connected between the gate and source of the driving transistor 121, and also a bootstrap circuit 130 and a threshold and mobility correction circuit 140 are provided. The bootstrap circuit 130 and the threshold and mobility correction circuit 140 are both examples of a driving current fluctuation suppressing unit for suppressing fluctuation of the driving current Ids accompanied with the property fluctuation of the driving transistor 121 or the organic EL element 127 which is an example of an electro-optic element.

The organic EL element 127 is a current light-emitting element, so the gradation of coloring is obtained by controlling the current amount to be applied to the organic EL element 127. Therefore, the current amount to be applied to the organic EL element 127 is controlled by changing the voltage applied to the gate terminal G of the driving transistor 121.

At this time, the bootstrap circuit 130 and the threshold and mobility correction circuit 140 are provided so as not to be influenced due to change over time of the organic EL element 127, and the property irregularities of the driving transistor 121. Thus, the vertical driving unit 103 for driving the pixel circuits P includes two threshold and mobility correction scanning units 114 and 115 in addition to the write scanning unit 104 and drive scanning unit 105.

In the drawing, only one pixel circuit P is illustrated, but as described with FIG. 1A, the pixel circuits P having the same configuration are arrayed in a matrix form. Here, n rows worth of write scanning lines 104WS_1 through 104WS_n driven with a write driving pulse WS by the write scanning unit 104, n rows worth of drive scanning lines 105DS_1 through 105DS_n driven with a scan driving pulse NDS by the drive scanning unit 105, n rows worth of threshold and mobility correction scanning lines 114AZ_1 through 114AZ_n driven with a threshold and mobility correction pulse AZ1 by the first threshold and mobility correction scanning unit 114, and n rows worth of threshold and mobility correction scanning lines 115AZ_1 through 115AZ_n driven with a threshold and mobility correction pulse AZ2 by the second threshold and mobility correction scanning unit 115 are wired to each pixel circuit P arrayed in a matrix form for each pixel row.

The bootstrap circuit 130 includes an n-channel type detecting transistor 124 to which the active-high threshold and mobility correction pulse AZ2 connected to the organic EL element 127 in parallel is supplied, and is configured of the detecting transistor 124 and the storage capacitor 120 connected between the gate and source of the driving transistor 121. The storage capacitor 120 is configured so as to also serve as a bootstrap capacitor.

The threshold and mobility correction circuit 140 includes an n-channel type detecting transistor 123 to which the active-high threshold and mobility correction pulse AZ1 is supplied between the gate terminal G of the driving transistor 121 and second power potential Vc2, and is configured of the detecting transistor 123, driving transistor 121, light-emitting transistor 122, and the storage capacitor 120 connected between the gate and source of the driving transistor 121. The storage capacitor 120 is configured so as to also serve as a threshold voltage storage capacitor for holding detected threshold voltage Vth.

With the driving transistor 121, the drain terminal D is first connected to the drain terminal D of the light-emitting control transistor 122. The source terminal S of the light-emitting control transistor 122 is connected to first power potential Vc1. Also, with the driving transistor 121, the source terminal S is directly connected to the anode terminal A of the organic EL element 127. The connection point thereof is assumed to be node ND121. The cathode terminal K of the organic EL element 127 is connected to a ground wiring Vcath (GND) common to all the pixels for supplying a reference potential, thereby supplying the cathode potential Vcath thereto.

Note that an n-channel type wherein the active-high driving pulse (scan driving pulse DS) is supplied to the gate terminal G which is the control input terminal can be employed as the light-emitting control transistor 122 instead of the p-channel type. In this case, with the re-channel type light-emitting control transistor 122, the drain terminal is connected to the first power supply potential Vc1, and the source terminal is connected to the drain terminal of the driving transistor 121.

With the sampling transistor 125, the gate terminal G is connected to the write scanning line 104WS from the write scanning unit 104, the source terminal S is connected to the picture signal line 106HS, and the drain terminal D is connected to the gate terminal G of the driving transistor 121. The connection point thereof is assumed to be node ND122. The storage capacitor 120 is connected between the node ND121 and node ND122. The active-high write driving pulse WS from the write scanning unit 104 is supplied to the gate terminal G of the sampling transistor 125. With the sampling transistor 125, as shown in parenthesis writing in the drawing, the source terminal S and drain terminal D can be inverted, the drain terminal D can be connected to the picture signal line 106HS as the signal input terminal, and the source terminal S can be connected to the gate terminal G of the driving transistor 121 as the signal output terminal.

The detecting transistor 123 is a switching transistor provided at the gate G (control input terminal) side of the driving transistor 121, wherein the source terminal S is connected to a ground potential Vofs which is an example of offset voltage, the drain terminal D is connected to the gate terminal G (node ND122) of the driving transistor 121, and the gate terminal G which is the control input terminal is connected to the threshold and mobility correction scanning line 114AZ. An arrangement is made wherein the potential of the gate terminal G of the driving transistor 121 is connected to the ground potential Vofs which is a fixed potential via the detecting transistor 123 by the detecting transistor 123 being turned on.

The detecting transistor 124 is a switching transistor, wherein the drain terminal D is connected to the node ND121 which is the connection point between the source terminal S of the driving transistor 121 and the anode terminal A of the organic EL element 127, the source terminal S is connected to a ground potential Vs1 which is an example of a reference potential, and the gate terminal G which is the control input terminal is connected to the threshold and mobility correction scanning line 115AZ.

An arrangement is made wherein the storage capacitor 120 is connected between the gate and source of the driving transistor 121, and the detecting transistor 124 is turned on, whereby the potential of the source terminal S of the driving transistor 121 is connected to the ground potential Vs1 which is a fixed potential via the detecting transistor 124.

The sampling transistor 125 operates at the time of being selected by the write scanning line 104WS, samples (the signal potential Vin of) an image signal Vsig from the picture signal line 106HS, and holds the voltage of the magnitude corresponding to the signal potential Vin in the storage capacitor 120 via the node ND122. The potential held in the storage capacitor 120 has ideally the same magnitude as the signal potential Vin, but is actually smaller than that.

The driving transistor 121 current-drives the organic EL element 127 according to the driving potential (voltage Vgs between the gate and source of the driving transistor 121 at that point) held in the storage capacitor 120 when the light-emitting control transistor 122 is ON, which is caused by the scan driving pulse NDS. The light-emitting control transistor 122 is electrically conducted at the time of being selected by the drive scanning line 105DS to supply a current to the driving transistor 121 from the first power potential Vc1.

Thus, the drain terminal D side which is the power supply terminal of the driving transistor 121 is connected to the first power potential Vc1 via the light-emitting control transistor 122, and the ON period of the light-emitting control transistor 122 is controlled, thereby enabling the light-emitting period and non-light-emitting period of the organic EL element 127 to be adjusted, and enabling duty driving to be performed.

The detecting transistors 123 and 124 operate at the time of both being selected by supplying the active-high threshold and mobility correction pulses AZ1 and AZ2 from the threshold and mobility correction scanning units 114 and 115 to the threshold and mobility correction scanning lines 114AZ and 115AZ, and performs a predetermined correction operation (operation for correcting the irregularities of the threshold voltage Vth or mobility .mu.). For example, in order to detect the threshold voltage Vth of the driving transistor 121 before current driving of the organic EL element 127 to cancel the influence thereof beforehand, the detected potential is held in the storage capacitor 120.

As a condition for assuring the normal operation of the pixel circuit P having such a configuration, the ground potential Vs1 is set lower than the level wherein the threshold voltage Vth of the driving transistor 121 is subtracted from the ground potential Vofs. That is to say, "Vs1<Vofs−Vth" holds.

Also, the level wherein the threshold voltage VthEL of the organic EL element 127 is added to the potential Vcath of the cathode terminal K of the organic EL element 127 is set higher than the level wherein the threshold voltage Vth of the driving transistor 121 is subtracted from the ground potential Vs1. That is to say, "Vcath+VthEL>Vs1−Vth" holds. It is desirable to set the level of the ground potential Vofs to close to the lowest level of the pixel signal Vsig supplied from the picture signal line 106HS (range at or below the lowest level).

With the pixel circuit P having such a configuration, the sampling transistor 125 is electrically conducted according to the write driving pulse WS supplied from the write scanning line 104WS during a predetermined signal write period (sampling period), and samples the picture signal Vsig supplied from the picture signal line 106HS to the storage capacitor 120. The storage capacitor 120 applies the input voltage (voltage Vgs between the gate and source) between the source and gate of the driving transistor 121 according to the sampled picture signal Vsig.

The driving transistor 121 supplies the output current according to the voltage Vgs between the gate and source to the organic EL element 127 as the driving current Ids during a predetermined light-emitting period. Note that this driving current Ids has dependency as to the carrier mobility .mu. and threshold voltage Vth of the channel area of the driving transistor 121. The organic EL element 127 is driven to emit light with the brightness corresponding to the picture signal Vsig (particularly, signal potential Vin) by the driving current Ids supplied from the driving transistor 121.

This pixel circuit P includes a correcting unit configured of switching transistors (light-emitting control transistor 122 and detecting transistors 123 and 124), which corrects the voltage Vgs between the gate and source held in the storage capacitor 120 at the top of a light-emitting period beforehand to eliminate the dependency as to the carrier mobility .mu. of the driving current Ids.

Specifically, the correcting unit (switching transistors 122, 123, and 124) operates at a part (e.g., later half side) of a signal write period according to the write driving pulse WS and scan driving pulse NDS supplied from the write scanning line 104WS and drive scanning line 105DS, extracts the driving current Ids from the driving transistor 121 in a state in which the picture signal Vsig is sampled, and subjects this to negative feedback to correct the voltage Vgs between the gate and source. Further, in order to eliminate the dependency as to the threshold voltage Vth of the driving current Ids, this correcting unit (switching transistors 122, 123, and 124) detects the threshold voltage Vth of the driving transistor 121 beforehand prior to a signal write period, and also adds the detected threshold voltage Vth to the voltage Vgs between the gate and source.

In particular, with the pixel circuit P according to the present example, the driving transistor 121 is an n-channel type transistor, wherein while the drain is connected to the positive power supply side, the source is connected to the organic EL element 127 side. In this case, the above-mentioned correcting unit extracts the driving current Ids from the driving transistor 121 at the top portion of a light-emitting period overlapped with a later portion of the signal write period, and subjects this to negative feedback to the storage capacitor 120 side.

At that time, the correcting unit P is configured such that the driving current Ids extracted from the source terminal S side of the driving transistor 121 at the top portion of the light-emitting period flows to the parasitic capacitor Cel included in the organic EL element 127. Specifically, the organic EL element 127 is a diode-type light-emitting element including an anode terminal A and cathode terminal K, wherein while the anode terminal A side is connected to the source terminal S of the driving transistor 121, the cathode terminal K side is connected to the ground side (cathode potential Vcath, in the present example).

According to this arrangement, with the correcting unit (switching transistors 122, 123, and 124), between the anode and cathode of the organic EL element 127 is set to a reverse bias state beforehand, and when the driving current Ids extracted from the source terminal S side of the driving transistor 121 flows to the organic EL element 127, the diode-type organic EL element 127 serves as a capacitive element.

Note that with the correcting unit, time width t necessary for extracting the driving current Ids from the driving transistor 121 within the signal write period can be adjusted, and it is desirable to optimize the negative feedback amount of the driving current Ids as to the storage capacitor 120.

Now, the terms "optimize the negative feedback amount" means to suitably set the phase difference between the write driving pulse WS and scan driving pulse NDS, and further preferably, enable mobility correction to be suitably performed even in any level within a range from a black level to a white level of a picture signal potential. The negative feedback amount applied to the voltage Vgs between the gate and source depends on the extraction time of the driving current Ids, so the longer the extraction time is, the greater the negative feedback amount is.

With regard to the pixel circuit and driving timing, there are various types of techniques, and various types of techniques can be taken as the technique at the time of "optimizing the negative feedback amount" according to those. For example, the voltage change property of the picture signal line 106HS which is a picture line signal potential, or the voltage change property of the write scanning line 104WS (i.e., transition property of the write driving pulse WS) is inclined, whereby a mobility correction period t is caused to automatically follow the picture line signal potential, and the optimization thereof is realized. According to those, the mobility correction period t can be determined even with the potential of the picture signal line 106HS, and a mobility correction parameter .DELTA.V can be represented with .DELTA.V=IdsCel/t.

As can be clearly understood from the expression of the mobility correction parameter .DELTA.V, the greater the driving current Ids which is the current between the drain and source of the driving transistor 121, the greater the mobility correction parameter .DELTA.V is. Conversely, the smaller the driving current Ids which is the current between the drain and source of the driving transistor 121, the smaller the mobility correction parameter .DELTA.V is. Thus, the mobility correction parameter .DELTA.V is determined according to the driving current Ids. At this time, the mobility correction period is not necessarily steady, and conversely, it is desirable to adjust the mobility correction period depending on the driving current Ids in some cases. For example, in the case of the driving current Ids being great, the mobility correction period is desired to be shortened, and conversely in the case of the driving current Ids being small, the mobility correction period is desired to be lengthened.

For example, the leading or trailing of the picture signal line potential (potential of the picture signal line 106HS) is inclined, or the change property of the write scanning line potential (particularly, the side for turning off the sampling transistor) is inclined, whereby a correction period t is automatically adjusted so as to be shortened when the potential of the picture signal line 106HS is high (when the driving current Ids is great), or so as to be lengthened when the potential of the picture signal line 106HS is low (when the driving current Ids is small). Thus, a suitable correction period can be automatically set by following the picture signal potential (signal potential Vin of the picture signal Vsig), whereby optimal mobility correction can be performed regardless of the brightness and pattern of an image. Both can be used together depending on the pixel circuit P or driving timing.

<Basic Operation>

First, as a comparative example to describe the features of the pixel circuit P according to the first embodiment, description will be made regarding an operation in the case wherein the light-emitting control transistor 122, detecting transistor 123, and detecting transistor 124 are not provided, and with the storage capacitor 120, one of the terminals is connected to the node ND122, and the other terminal is connected to the ground wiring Vcath (GND) common to all pixels. Hereafter, such a pixel circuit P is referred to as the pixel circuit P according to the comparative example.

With the pixel circuit P according to the comparative example, the potential of the source terminal S (source potential Vs) of the driving transistor 121 is determined with the operating point between the driving transistor 121 and organic EL element 127, and the voltage value thereof differs depending on the gate potential Vg of the driving transistor 121.

In general, as shown in FIG. 3A, the driving transistor 121 is driven in a saturation area. Accordingly, if we say that the current flowing between the drain terminal and source terminal of a transistor which operates in a saturation area is Ids, mobility is .mu., channel width (gate width) is W, channel length (gate length) is L, gate capacity (gate oxide capacity per unit area) is Cox, and the threshold voltage of the transistor is Vth, the driving transistor 121 is a constant current source having the value shown in the following Expression (1). Note that " " denotes exponentiation. As can be clearly understood from Expression (1), with a saturation area, the drain current Ids of a transistor is controlled by the voltage Vgs between the gate and source, and is operated as a constant current source.

$$Ids = 1⁄2 .mu. WLCox(Vgs-Vth)^2 \quad (1) \qquad \#\#EQU00001\#\#$$

<Iel-Vel Property and I-V Property of Light-Emitting Element>

With the current-voltage (Iel-Vel) property of a current-driven light-emitting element represented with the organic EL element shown in (1) in FIG. 3B, a curve shown in a solid line indicates the property at the time of an initial state, and a curve shown in a dashed line indicates the property after change over time. In general, the I-V property of a current-driven light-emitting element including an organic EL element deteriorates over time, as shown in the graph.

For example, when a light-emitting current Iel flows to the organic EL element 127 which is an example of light-emitting elements, the voltage Vel between the anode and cathode thereof is uniquely determined. As shown in (1) in FIG. 3B, during a light-emitting period, the light-emitting current Iel determined by the current Ids between the drain and source (=driving current Ids) of the driving transistor 121 flows to the anode terminal A of the organic EL element 127, which increases the voltage between the anode and cathode by the voltage Vel between the anode and cathode.

With the pixel circuit P according to the comparative example, the voltage Vel between the anode and cathode as to the same light-emitting current Iel changes from Vel1 to Vel2 according to change over time of the I-V property of the organic EL element 127, which causes the operating point of the driving transistor 121 to change, causes the source potential Vs of the driving transistor 121 to change even if the same gate potential Vg is applied thereto, and consequently, causes the voltage Vgs between the gate and source of the driving transistor 121 to change.

With a simple circuit employing an n-channel type as the driving transistor 121, the source terminal S is connected to the organic EL element 127 side, which causes the I-V property of the organic EL element 127 to be influenced by change over time, which causes the current amount (light-emitting current Iel) flowing to the organic EL element 127 to change, and consequently, light-emitting brightness changes.

Specifically, with the pixel circuit P according to the comparative example, the operating point changes due to change over time of the I-V property of the organic EL element 127, and the source potential Vs of the driving transistor 121 changes even if the same gate potential Vg is applied thereto. Thus, the voltage Vgs between the gate and source of the driving transistor 121 changes. As can be clearly understood from property Expression (1), upon the voltage Vgs between the gate and source fluctuating, the driving current Ids fluctuates even if the gate potential Vg is steady, and the value of a current flowing to the organic EL element 127 changes simultaneously. Thus, upon the I-V property of the organic EL element 127 changing, the light-emitting brightness of the organic EL element 127 changes over time with the pixel circuit P according to the comparative example.

With a simple circuit employing an n-channel type as the driving transistor 121, the source terminal S is connected to the organic EL element 127 side, which causes the voltage Vgs between the gate and source to change over time of the organic EL element 127, which causes the current amount flowing to the organic EL element 127 to change, and consequently, light-emitting brightness changes.

The anode potential fluctuation of the organic EL element 127 due to the property fluctuation over time of the organic EL element 127 which is an example of light-emitting elements appears as fluctuation of the voltage Vgs between the gate and source of the driving transistor 121, which causes fluctuation of the drain current (driving current Ids). Fluctuation of the driving current due to this cause appears as the irregularities of light-emitting brightness for each pixel circuit P, which causes image quality deterioration.

On the other hand, the details will be described later, at a point where the information corresponding to the signal potential Vin is written in the storage capacitor 120 (continuously during the light-emitting period of the organic EL element 127 thereafter), a bootstrap operation is activated, which drives a circuit configuration for realizing a bootstrap function for linking between fluctuation of the potential Vs of the source terminal S of the driving transistor 121 and potential Vg of the gate terminal G thereof by setting the sampling transistor 125 to a non-electroconductive state.

Thus, even if there is anode potential fluctuation (i.e., source potential fluctuation) of the organic EL element 127 due to the property fluctuation over time of the organic EL element 127, the gate potential Vg fluctuates so as to cancel the fluctuation thereof, whereby the uniformity of screen brightness can be ensured. According to the bootstrap function, the fluctuation over time correction performance of a current-driven light-emitting element with an organic EL element as a representative can be improved.

This bootstrap function can be started at a light-emitting start point where the write driving pulse WS is switched to an inactive-low state, and the sampling transistor 125 is turned off, thereafter the light-emitting current Iel.—begins to flow to the organic EL element 127, and during a process where the voltage Vel between the anode and cathode increases until the voltage Vel between the anode and cathode stabilizes, this function works even in the case of the source potential Vs of the driving transistor 121 fluctuating due to fluctuation of the voltage Vel between the anode and cathode.

<Vgs-Ids Property of Driving Transistor>

Also, according to the manufacturing process irregularities of the driving transistor 121, there is caused property fluctuation such as threshold voltage and mobility and so forth for each pixel circuit P. In the case of driving the driving transistor 121 in a saturation area also, according to this property fluctuation, even if the same gate potential is applied to the driving transistor 121, the drain current (driving current Ids) fluctuates for each pixel circuit P, which appears as light-emitting brightness irregularities.

For example, (2) in FIG. 3B illustrates voltage-current (Vgs-Ids) property focusing attention on the threshold irregularities of the driving transistor 121. Property curves are shown in the drawing regarding the two driving transistors 121 of which the threshold voltage differs, such as Vth1 and Vth2.

As described above, the drain current Ids when the driving transistor 121 operates in a saturation area is represented with property Expression (1). As can be clearly understood from property Expression (1), upon the threshold voltage Vth fluctuating, the drain current Ids fluctuates even if the voltage Vgs between the gate and source is steady. That is to say, if the irregularities of the threshold voltage Vth is left as it is, as shown in (2) in FIG. 3B, while the driving current corresponding to the Vgs is Ids1 when the threshold voltage is Vth1, the driving current corresponding to the same gate voltage Vgs is Ids2 when the threshold voltage is Vth2, which differs from Ids1.

Also, (3) in FIG. 3B illustrates voltage-current (Vgs-Ids) property focusing attention on the mobility irregularities of the driving transistor 121. Property curves are shown in the drawing regarding the two driving transistors 121 of which the mobility differs, such as .mu.1 and .mu.2.

As can be clearly understood from property Expression (1), upon the mobility .mu. fluctuating, the drain current Ids fluctuates even if the voltage Vgs between the gate and source is steady. That is to say, if the irregularities of the mobility .mu. is left as it is, as shown in (3) in FIG. 3B, while the driving current corresponding to the Vgs is Ids1 when the mobility is .mu.1, the driving current corresponding to the same gate voltage Vgs is Ids2 when the mobility is .mu.2, which differs from Ids1.

As shown in (2) and (3) in FIG. 3B, if there is a great difference regarding the Vin-Ids property due to the difference of the threshold voltage Vth or mobility .mu., the driving current Ids, i.e., light-emitting brightness differs even if the same signal potential Vin is applied to the transistors, and accordingly, uniformity of screen brightness cannot be obtained.

<Concept of Threshold Correction and Mobility Correction>

On the other hand, driving timing for realizing the threshold correction function and mobility correction function (details will be described later) is employed, whereby influence of such fluctuation can be suppressed, and uniformity of screen brightness can be ensured.

With the threshold correction operation and mobility correction operation of the present embodiment, though the details will be described later, the voltage Vgs between the gate and source at the time of emitting light is arranged to be represented with "Vin+Vth−.DELTA.V", thereby preventing the current Ids between the drain and source from depending on the irregularities and fluctuation of the threshold voltage Vth, and also from depending on the irregularities and fluctuation of the mobility .mu. Consequently, even if the threshold voltage Vth or mobility .mu. fluctuates due to a manufacturing process or over time, the driving current Ids does not fluctuate, and the light-emitting brightness of the organic EL element 127 does not fluctuate.

For example, FIG. 3C is a graph describing the operating point of the driving transistor 121 at the time of the mobility correction. If the irregularities of the mobility .mu.1 and .mu.2 at the time of a manufacturing process or over time are subjected to threshold correction or mobility correction which enables the voltage Vgs between the gate and source at the time of emitting light to be represented with "Vin+Vth−.DELTA.V", first from the perspective of mobility, a mobility correction parameter .DELTA.V1 is determined as to the mobility .mu.1, and a mobility correction parameter .DELTA.V2 is determined as to the mobility .mu.2.

Thus, a suitable mobility correction parameter is determined as to any mobility, so the driving current Idsa at the time of the mobility .mu.1 and the driving current Idsb at the time of the mobility .mu.2 of the driving transistor 121 are determined. Though there are great current irregularities before the mobility correction, the current irregularities become small due to the mobility correction, and the difference of the mobility .mu. is suppressed. In an optimal state, "Idsa=Idsb" can be held, and the difference of the mobility .mu. can be eliminated (cancelled out).

If the current irregularities are not subjected to the mobility correction, as shown in (3) in FIG. 3A, when the mobility differs, such as .mu.1 and .mu.2, as to the voltage Vgs between the gate and source, the driving current Ids also greatly differs according to this, such as Ids1 and Ids2. In order to handle this, suitable mobility correction parameters .DELTA.V1 and .DELTA.V2 are applied to the mobility .mu.1 and .mu.2 respectively, whereby the driving current Ids becomes Idsa and Idsb, and each of the mobility correction parameters .DELTA.V1 and .DELTA.V2 are optimized, whereby the driving current Idsa and Idsb after the mobility correction can be approximated, and can be set to the same level in the optimal state.

At the time of the mobility correction, as can be clearly understood from the graph in FIG. 3C, while the great mobility .mu.1 is subjected to negative feedback so as to increase the mobility correction parameter .DELTA.V1, the small mobility .mu.2 is subjected to negative feedback so as to decrease the mobility correction parameter .DELTA.V2. In this sense, the mobility correction parameter .DELTA.V is also referred to as negative feedback amount .DELTA.V.

Also, each drawing of FIG. 3D illustrates the relations between the signal potential Vin and driving current Ids from the perspective of the threshold correction. For example, in each drawing of FIG. 3D, the signal potential Vin is taken as the horizontal axis, and the driving current Ids is taken as the vertical axis, and the current-voltage property of the driving transistor 121 is illustrated regarding a pixel circuit Pa (solid line curve) configured of the driving transistor 121 wherein the threshold voltage Vth is relatively low, and the mobility .mu. is relatively great, and a pixel circuit Pb (dotted line curve) configured of the driving transistor 121 wherein the threshold voltage Vth is relatively high, and the mobility .mu. is relatively small, which are illustrated as property curves.

(1) in FIG. 3D is a case wherein neither the threshold correction nor the mobility correction is executed. In this case, the correction regarding the threshold voltage Vth and mobility .mu. is not executed at the pixel circuit Pa and pixel circuit Pb at all, so the difference regarding the threshold voltage Vth and mobility .mu. causes great difference in the Vin-Ids property. Accordingly, even if the same signal potential Vin is applied to both circuits, the driving current Ids, i.e., light-emitting brightness differs, and consequently, uniformity of screen brightness cannot be obtained.

(2) in FIG. 3D is a case wherein while the threshold correction is executed, the mobility correction is not executed. In this case, the difference of the threshold voltage Vth is cancelled at the pixel circuit Pa and pixel circuit Pb. Note however, the difference of the mobility .mu. appears as is. Accordingly, with an area where the signal potential Vin is high (i.e., an area where brightness is high), the difference of mobility .mu. appears markedly, the brightness differs even with the same gradation. Specifically, with the same gradation (same signal potential Vin), the brightness (driving current Ids) of the pixel circuit Pa of which the mobility .mu. is great is high, and the brightness of the pixel circuit Pb of which the mobility .mu. is small is low.

(3) in FIG. 3D is a case wherein both the threshold correction and the mobility correction are executed. In this case, the difference regarding the threshold voltage Vth and mobility .mu. is completely corrected, and as a result thereof the Vin-Ids properties of the pixel circuit Pa and pixel circuit Pb are matched. Accordingly, the brightness (Ids) becomes the same level at all of gradations (signal potential Vin), so uniformity of screen brightness is markedly improved.

(4) in FIG. 3D is a case wherein both the threshold correction and the mobility correction are executed, but the correction of the threshold voltage Vth is insufficient. For example, an example thereof is a case wherein the voltage equivalent to the threshold voltage Vth of the driving transistor 121 cannot be held in the storage capacitor 120 with one-time threshold correction operation. At this time, the difference of the threshold voltage Vth is not eliminated, so the difference appears on the brightness (driving current Ids) at a low-gradation area of the pixel circuit Pa and pixel circuit Pb. Accordingly, in the case of the correction of the threshold voltage Vth being insufficient, unevenness of brightness appears at a low gradation, which impairs image quality.

Operation of Pixel Circuit: First Embodiment

FIG. 4 is a timing chart describing the operation of the pixel circuit P according to the first embodiment. In FIG. 4, the waveforms of the write driving pulse WS, threshold and mobility correction pulses AZ1 and AZ2, and scan driving pulse NDS are represented along a time axis t. As can be understood from the above description, the switching transistors 123, 124, and 125 are n-channel types, so are turned on when the respective pulses WS, AZ1, and AZ2 are in a high-level state, and turned off when the pulses are in a low-level state. On the other hand, the light-emitting control transistor 122 is a p-channel type, so is turned off when the scan driving pulse NDS is in a high-level state, and turned on when the pulse is in a low-level state. Note that this timing chart also represents the potential change of the gate terminal G and the potential change of the source terminal S of the driving transistor 121 as well as the waveforms of the respective pulses WS, AZ1, AZ2, and DS.

With the pixel circuit P, in a usual light-emitting state, the scan driving pulse NDS alone output from the drive scanning unit 105 is in an active-low state, and the write driving pulse WS and threshold and mobility correction pulses AZ1 and AZ2 each output from the write scanning unit 104 and threshold and mobility correction scanning units 114 and 115 are in an inactive-low state, which is a state wherein the light-emitting control transistor 122 alone is turned on.

Each row of the pixel array unit 102 is sequentially scanned one during one field. At the previous period before this field starts all of the pulses WS, AZ1, AZ2, and DS are in a low-level state. Accordingly, while the n-channel type switching transistors 123, 124, and 125 are in an OFF state, the p-channel type light-emitting control transistor 122 alone is in an ON state.

Accordingly, the driving transistor 121 is connected to the first power potential Vc1 via the light-emitting control transistor 122 which is in an ON state, so supplies the driving current Ids to the organic EL element 127 according to the predetermined voltage Vgs between the gate and source. Accordingly, the organic EL element 127 emits light at or before timing t1. At this time, the voltage Vgs between the gate and source applied to the driving transistor 121 is represented with the difference between the gate potential Vg and source potential Vs.

At this time, the driving transistor 121 is set so as to be operated in a saturation area, so if we say that the current flowing between the drain terminal and source terminal of the transistor which operates in a saturation area is Ids, mobility is .mu., channel width is W, channel length is L, gate capacity is Cox, the threshold voltage of the transistor is Vth, in principle, the driving transistor 121 is a constant supply source having the value shown in Expression (1).

At timing t1 wherein a new field begins, the scan driving pulse NDS is switched from in a low-level state to high-level state (a). Accordingly, upon entering timing t1, all of the switching transistors 122 through 125 are turned off. Thus, the light-emitting control transistor 122 is turned off, and the driving transistor 121 is isolated from the first power supply potential Vc1, so the gate voltage Vg and source voltage Vs drop, and light emitting of the organic EL element 127 stops and enters a non-light-emitting period.

Next, the detecting transistors 123 and 124 are turned on by setting the threshold and mobility correction pulses AZ1 and AZ2 to an active-high state in order (t2), following which the detecting transistor 123 side alone is turned off by setting the threshold and mobility correction pulse AZ2 to an inactive-low state while keeping the threshold and mobility correction pulse AZ2 in an active-high state (t4). Note that either of the detecting transistors 123 and 124 may be turned on first. Thus, current is prevented from flowing to the organic EL element 127, and the organic EL element 127 is set to a non-light-emitting state. The example shown in the drawing illustrates a state wherein both are turned on almost simultaneously.

At this time, with the driving transistor 121, the source potential Vs of the driving transistor 121 is initialized by the ground potential Vs1 being supplied to the source terminal S via the detecting transistor 124, and further, the gate potential Vg of the driving transistor 121 is initialized by the ground potential Vofs being supplied to the gate terminal G via the detecting transistor 123 (t2 through t4).

Thus, the potential difference of both terminals of the storage capacitor 120 connected between the gate and source of the driving transistor 121 is set to be at or above the threshold voltage Vth of the driving transistor 121. At this time, the voltage Vgs between the gate and source of the driving transistor 121 takes a value "Vofs−Vs1", but the condition "Vs1<Vofs−Vth" has been set, so the driving transistor 121 maintains the ON state, and the current Ids1 according thereto is applied thereto.

Now, in order to cause the organic EL element 127 to be in a non-light-emitting state, it is necessary to realize the relation of Vcath+VthEL>Vs2−Vth, i.e., to set the voltage of the ground potentials Vofs and Vs1 such that the voltage Vel(=Vs1−Vth) applied to the anode terminal A of the organic EL element 127 is smaller than the sum of the threshold voltage VthEL and cathode voltage Vcath of the organic EL element 127. Thus, the organic EL element 127 goes to a reverse bias state, which is smaller than the current of the driving transistor 121, and goes to a non-light-emitting state.

Accordingly, the drain current Ids1 of the driving transistor 121 flows to the ground potential Vs1 from the first power supply potential Vc1 via the detecting transistor 124 which is in an ON state. Also, a condition "Vofs−Vs1=Vgs>Vth" is set, thereby performing the preparation for the irregularities correction of the threshold voltage Vth to be performed at timing t5 thereafter. In other words, the periods t2 through t5 are equivalent to the reset period (initializing period) of the driving transistor 121 or the preparation period for the mobility correction.

Also, with regard to the threshold voltage VthEL of the organic EL element 127, VthEL>Vs1 has been set. Thus, minus bias is applied to the organic EL element 127, and the organic EL element 127 goes to a so-called reverse bias state. This reverse bias state is necessary for operating the later-performed irregularities correction of the threshold voltage Vth and the later-performed irregularities correction of the carrier mobility .mu. normally.

Next, the threshold and mobility correction pulse AZ2 is set to an inactive-low state (t4), almost simultaneous therewith (delayed somewhat) the scan driving pulse NDS is set to an active-low state (t5). Thus, while the detecting transistor 124 is turned off, the light-emitting control transistor 122 is turned on. As a result thereof, the driving current Ids flows to the storage capacitor 120, and the stage enters a threshold correction period for correcting (cancelling) the threshold voltage Vth of the driving transistor 121.

The gate terminal G of the driving transistor 121 is held in the ground potential Vofs, and the driving current Ids flows until the source potential Vs of the driving transistor 121 increases up to cutoff. Upon the driving transistor 121 cutting off, the source potential Vs of the driving transistor 121 becomes "Vofs-Vth".

That is to say, the equivalent circuit of the organic EL element 127 is represented with a parallel circuit of a diode and the parasitic capacitor Cel, so as long as "Vel.1toreq.Vcath+VthEL" holds, i.e., as long as the leak current of the organic EL element 127 is considerably smaller than the current flowing to the driving transistor 121, the current of the driving transistor 121 is employed for charging the storage capacitor 120 and parasitic capacitor Cel.

As a result thereof, upon the current path of the drain current. Ids flowing to the driving transistor 121 being cut off, the voltage Vel of the anode terminal A of the organic EL element 127, i.e., the potential of the node ND121 increases over time. Subsequently, upon the potential difference between the potential (source voltage Vs) of the node ND121 and the voltage (gate voltage Vg) of the node ND122 just reaching the threshold voltage Vth, the driving transistor 121 is changed to an OFF state from an ON state, the drain current stops flowing, and thus, the threshold correction period ends. That is to say, following fixed time elapsing, the voltage Vgs between the gate and source of the driving transistor 121 takes a value such as the threshold voltage Vth.

At this time, the condition "Vel=Vofs−Vth.1toreq.Vcath+VthEL" has been set. That is to say, the potential difference appeared between the node ND121 and node ND122=threshold voltage Vth is held in the storage capacitor 120. Thus, the respective detecting transistors 123 and 124 operate at the time of being selected at suitable timing by the threshold and mobility correction scanning lines 114AZ and 115AZ respectively, detect the threshold voltage Vth of the driving transistor 121, and hold this in the storage capacitor 120.

The scan driving pulse NDS is switched to an inactive-high state (t6), and further the threshold and mobility correction pulse AZ1 is switched to an inactive-low state (t7) in this order, whereby the light-emitting control transistor 122 and detecting transistor 123 are turned off in order, whereby the threshold cancel operation ends. The light-emitting control transistor 122 is turned off prior to the detecting transistor 123, whereby fluctuation of the voltage Vg of the gate terminal G of the driving transistor 121 can be suppressed.

Note that even after threshold cancel (Vth correction period) elapses, the detected threshold voltage Vth of the driving transistor 121 is held in the storage capacitor 120 as a potential for correction. Thus, the timing t5 through t6 are periods for detecting the threshold voltage Vth of the driving transistor 121. Here, the detection periods t5 through t6 are referred to as a threshold correction period.

Here, a case wherein the threshold correction operation is performed once alone is illustrated, but this is not indispensable. For example, an arrangement may be made wherein one horizontal period is taken as a processing cycle, and the threshold correction operation is repeatedly performed multiple times. Usually, a threshold correction period is shorter than one horizontal period. Accordingly, a case may be caused due to various causes wherein the correct voltage corresponding to the threshold voltage Vth cannot be held in the storage capacitor 120 during this short one-time threshold correction operation period. In order to eliminate this problem, it is desirable to repeat the threshold correction operation multiple times. Though drawing regarding the timing thereof will be omitted here, the threshold correction operation is performed repeatedly with multiple horizontal cycles prior to sampling (signal writing) of the signal potential Vin to the storage capacitor 120, whereby the voltage equivalent to the threshold voltage Vth of the driving transistor 121 is held in the storage capacitor 120 in a sure manner.

Next, the write driving pulse WS is set to an active-high state, the sampling transistor 125 is turned on, and the pixel signal Vsig for the storage capacitor 120 is written therein (also referred to as "sampling period") (t8 through t10). Such sampling of the picture signal Vsig is performed until timing t10 wherein the write driving pulse WS returns to an inactive-low state. That is to say, timing t8 through t10 are referred to as a signal write period (hereafter, also referred to as a sampling period). Usually, a sampling period is set to one horizontal period (1H).

With this sampling period (t8 through t10), the signal potential Vin of the pixel signal Vsig is supplied to the gate terminal G of the driving transistor 121, whereby the gate voltage Vg is taken as the driving potential corresponding to the signal potential Vin. The ratio of the magnitude of information to be written in the storage capacitor 120, corresponding to the signal potential Vin is referred to as a write gain Ginput. At this time, the pixel signal Vsig is held in a manner of being added to the threshold voltage Vth of the driving transistor 121. As a result thereof, fluctuation of the threshold voltage Vth of the driving transistor 121 is constantly cancelled, which is equivalent to performing threshold correction.

The voltage Vgs between the gate and source of the driving transistor 121, i.e., the driving potential to be written in the storage capacitor 120 is determined by the storage capacitor 120 (capacity value Cs), the parasitic capacitor Cel (capacity value Cel) of the organic EL element 127, and the parasitic capacitor (capacity value Cgs) between the gate and source, such as shown in Expression (2). The driving current Ids is basically determined with the signal potential Vin of the picture signal Vsig. In other words, the organic EL element 127 emits light with brightness according to the signal potential Vin.

$$Vgs=Cel\ Cel+Cs+Cgs(Vsig-Vofs)+Vth(2) \quad \#\#EQU00002\#\#$$

Note however, in general, the parasitic capacitor Cel is far greater than the capacity value Cs of the storage capacitor 120 and the parasitic capacity value Cgs, i.e., the storage capacitor 120 is sufficiently small as compared with the parasitic capacitor (equivalent capacitor) Cel of the organic EL element 127. As a result thereof, almost most of the picture signal Vsig is written in the storage capacitor 120. In accuracy, the difference of the Vsig as to the Vofs, "Vsig–Vofs", is written in the storage capacitor 120.

Accordingly, the voltage Vgs between the gate and source of the driving transistor 121 is equal to "Vsig–Vofs+Vth" wherein the threshold voltage Vth previously detected and held, and "Vsig–Vofs" subjected to sampling this time are added. At this time, if the ground potential Vofs is set to around the black level of the pixel signal Vsig, Vofs=0V can be held, and consequently, the voltage Vgs between the gate and source (=driving potential) is equal to "Vsig+Vth(=Vin+Vth)".

The scan driving pulse NDS is set to an active-low state before timing t10 wherein the signal write period ends, and the light-emitting control transistor 122 is turned on (t9). Thus, the drain terminal D of the driving transistor 121 is connected to the first power supply potential Vc1 via the light-emitting control transistor 122, so the pixel circuit P advances from the non-light-emitting period to a light-emitting period.

Thus, at the periods t9 and t10 wherein the sampling transistor 125 is still in an ON state, and also the light-emitting control transistor 122 enters an ON state, the mobility correction of the driving transistor 121 is performed. The overlapped period (referred to a mobility correction period) of the active periods of the write driving pulse WS and scan driving pulse NDS is adjusted, thereby optimizing the correction of mobility of the driving transistor 121 of each pixel. That is to say, mobility correction is suitably performed at the periods t9 and t10 wherein the rear portion of the signal write period and the top portion of the light-emitting period are overlapped.

Also, at this time, the change property of the write scanning line potential at the side for turning off the sampling transistor 125 is inclined, whereby the mobility correction period is automatically adjusted so as to be shortened when the potential of the picture signal line 106HS is high (when the driving current Ids is great), or so as to be lengthened when the potential of the picture signal line 106HS is low (when the driving current Ids is small). Thus, the mobility correction period can be set to an optimal state by following the picture signal potential (signal potential Vin of the picture signal Vsig). Thus, optimal mobility correction can be performed regardless of the brightness and pattern of an image.

Note that at the top of the light-emitting period where this mobility correction is performed, the organic EL element 127 is actually in a reverse bias state, and accordingly does not emit light. At the mobility correction periods t9 and t10, the driving current Ids flows to the driving transistor 121 in a state wherein the gate terminal G of the driving transistor 121 is fixed to the potential corresponding to the picture signal Vsig (signal potential Vin, in detail).

Now, "Vofs–Vth<VthEL" has been set, whereby the organic EL element 127 is set to a reverse bias state, and accordingly this indicates not diode property but simple capacity property. Accordingly, the driving current Ids flowing to the driving transistor 121 is written with the capacity "C=Cs+Cel" where both of the capacity value Cs of the storage capacitor 120 and the capacity value Cel of the parasitic capacitor (equivalent capacitor) Cel of the organic EL element 127 are combined. Thus, the source potential Vs of the driving transistor 121 increases.

With the timing chart shown in FIG. 4, this increase is represented with .DELTA.V. This increase, i.e., the negative feedback amount .DELTA.V which is a mobility correction parameter is ultimately subtracted from the voltage Vgs between the gate and source held in the storage capacitor 120, which is equivalent to applying negative feedback thereto. Thus, the driving current Ids of the driving transistor 121 is subjected to negative feedback to the voltage Vgs between the gate and source of the same driving transistor 121, whereby mobility .mu. can be corrected. Note that the negative feedback amount .DELTA.V can be optimized by adjusting the time width t of the mobility correction periods t9 and t10.

In the present example case, the higher the picture signal Vsig is, the greater the driving current Ids is, and also the greater the absolute value of the .DELTA.V is. Accordingly, mobility correction depending on a light-emitting brightness level can be performed. Also, in the case of taking a high-mobility driving transistor 121 and a low-mobility driving transistor 121 into consideration, if we say that the picture signal Vsig is constant, the greater the mobility .mu. of the driving transistor 121 is, the greater the absolute value of the .DELTA.V is.

In other words, the driving transistor 121 of which the mobility is high at the mobility correction period, the source potential greatly increases as to the low-mobility driving transistor 121. Also, the greater the source potential increases, the smaller the potential difference between the gate and source becomes, and consequently, negative feedback is applied so as to make it difficult to apply current. The greater the mobility .mu. is, the greater the negative feedback amount .DELTA.V is, whereby the irregularities of the mobility .mu. for each pixel can be eliminated. Even with the driving transistors 121 having different mobility, the same driving current Ids can be applied to the organic EL element 127. The mobility correction periods are adjusted, whereby the magnitude of the negative feedback amount .DELTA.V can be set to the optimal state.

Next, the write scanning unit 104 switches the write driving pulse WS to an inactive-low state (t10). Thus, the sampling transistor 125 goes to a non-electroconductive (OFF) state, and the stage proceeds to a light-emitting period. Subsequently, the stage proceeds to the next frame (or field), where the threshold correction preparation operation, threshold correction operation, mobility correction operation, and light-emitting operation are repeated again.

As a result thereof, the gate terminal G of the driving transistor 121 is isolated from the picture signal line 106HS. Applying of the signal potential Vin to the gate terminal G of the driving transistor 121 is cancelled, so the gate potential Vg of the driving transistor 121 can increase.

At this time, the driving current Ids flowing to the driving transistor 121 flows to the organic EL element 127, and the anode potential of the organic EL element 127 increases according to the driving current Ids. This increase is assumed to be Vel. At this time, the voltage Vgs between the gate and source of the driving transistor 121 is steady according to the effects by the storage capacitor 120, so the driving transistor 121 flows a constant current (driving current Ids) to the organic EL element 127. As a result thereof, voltage drop occurs, and the potential Vel of the anode terminal A of the organic EL element 127 (=the potential of the node ND121) increases up to the voltage wherein a current such as the driving current Ids can flow to the organic EL element 127. During that time, the voltage Vgs between the gate and source held in the storage capacitor 120 maintains the value of "Vsig+Vth−.DELTA.V (=Vin+Vth−.DELTA.V)".

Eventually, the reverse bias state of the organic EL element 127 is cancelled along with increase of the source potential Vs, so the organic EL element 127 actually starts emitting of light according to inflow of the driving current Ids. The increase of the anode potential of the organic EL element 127 at this time (Vel) is exactly increase of the source potential Vs of the driving transistor 121, and the source potential Vs of the driving transistor 121 becomes "−Vth+.DELTA.V+Vel".

The relations between the driving current Ids at the time of emitting light and the gate voltage Vgs can be represented such as shown in Expression (3) by substituting "Vsig+Vth−.DELTA.V(=Vin+Vth−.DELTA.V)" for the Vgs of Expression (1) which represents the previous transistor property.

$$Ids = k.mu.(Vgs-Vth)^2 = k.mu.(Vsig-.DELTA.V)^2 = k.mu.(Vin-.DELTA.V)^2 \quad (3)$$ ##EQU00003##

In Expression (3), k=(1/2) (W/L) Cox holds. From this Expression (3), it can be found that the term of the threshold voltage Vth is cancelled, and the driving current Ids supplied to the organic EL element 127 does not depend on the threshold voltage Vth of the driving transistor 121. The driving current Ids is basically determined with the signal voltage Vin of the picture signal Vsig. In other words, the organic EL element 127 emits light with the brightness corresponding to the picture signal Vsig.

At this time, the signal potential Vin is corrected with the feedback amount .DELTA.V. This correction amount .DELTA.V serves so as to cancel the effects of the mobility .mu. positioned at the coefficient portion of Expression (3). Note that though the detailed description will be omitted, the mobility correction terms shown in Expression (3) is subjected to numerical analysis, whereby the driving current Ids as to the mobility correction time can be represented such as shown in Expression (4).

$$Ids = k.mu.(Vsig1+Vsig\ k.mu.Ct)2 = k.mu.(Vin\ 1+Vin\ k.mu.Ct)2 \quad (4)$$ ##EQU00004##

Accordingly, the driving current Ids substantially depends on the signal potential Vin alone. The driving current Ids does not depend on the threshold voltage Vth, so even if the threshold voltage Vth is changed by a manufacturing process, the driving current Ids between the drain and source does not fluctuate, and the light-emitting brightness of the organic EL element 127 does not fluctuate.

Also, the storage capacitor 120 is connected between the gate terminal G and source terminal S of the driving transistor 121, the bootstrap operation is performed at the beginning of the light-emitting period due to the effects by the storage capacitor 120 thereof, while the voltage between the gate and source of the driving transistor 121 "Vsig=Vin−.DELTA.V+Vth" is kept steady, the gate potential Vg and source potential Vs of the driving transistor 121 increase. Upon the source potential Vs of the driving transistor 121 becoming "−Vth+.DELTA.V+Vel", the gate potential Vg becomes "Vin+Vel".

Here, with the organic EL element 127, if the light-emitting time is lengthened, the I-V property thereof is changed. Therefore, the potential of the node ND 121 is also changed. Note however, according to the effects by the storage capacitor 120, the potential of the node ND122 also increases linked with increase in the potential of the node ND121, so the voltage Vgs between the gate and source of the driving transistor 121 is constantly kept in almost "Vsig+Vth−.DELTA.V(=Vin+Vth−.DELTA.V)" regardless of increase in the potential of the node ND121, and accordingly, the current flowing to the organic EL element 127 does not change. Accordingly, even if the I-V property of the organic EL element 127 deteriorates, the constant current Ids always continues flowing, so the organic EL element 127 continues to emit light with the brightness corresponding to the pixel signal Vsig, and accordingly, the brightness never changes.

Thereafter, upon reaching the timing t1 of the next field, the scan driving pulse NDS is set to an inactive-high state, the light-emitting control transistor 122 is turned off, light emitting ends, and also this filed ends. Thereafter, in the same way as with the above description, the stage proceeds to the operation of the next field, the threshold voltage correction operation, mobility correction operation, and light-emitting operation are repeated.

Thus, with the pixel circuit P according to the present embodiment, the bootstrap circuit 130 is configured to serve as a driving signal stabilizing circuit for correcting change in the current-voltage property of the organic EL element 127 which is an example of electro-optic elements to keep the driving current steady.

Also, with the pixel circuit P according to the present embodiment, the threshold and mobility correction circuit 140 is provided, and according to the operations of the detecting transistors 123 and 124 during the threshold correction period, the constant current Ids which is not influenced by the irregularities of the threshold voltage Vth by cancelling the threshold voltage Vth of the driving transistor 121, whereby an image can be displayed with a stable gradation corresponding to an input pixel signal, and accordingly, a high quality image can be obtained.

Additionally, according to the operation during the mobility correction period by the light-emitting control transistor 122 liked with the write operation of the picture signal Vsig by the sampling transistor 125, the constant current Ids which is not influenced by the irregularities of the carrier mobility .mu. can be applied as the potential Vgs between the gate and source where the carrier mobility .mu. of the driving transistor 121 is reflected, whereby an image can be displayed with a stable gradation corresponding to an input pixel signal, and accordingly, a high quality image can be obtained.

That is to say, in order to prevent influence on the driving current Ids due to the property irregularities of the driving transistor 121 (the irregularities of the threshold voltage Vth and carrier mobility .mu., in the present example), the threshold and mobility correction circuit 140 is configured to serve as a driving signal stabilizing circuit for correcting influence due to the threshold voltage Vth and carrier mobility .mu. to keep the driving current steady.

The circuit configurations of the bootstrap circuit 130 and threshold and mobility correction circuit 140 shown in the present embodiment are but an example of the driving signal stabilizing circuit for keeping the driving signal for driving the organic EL element 127 using an n-channel type as the driving transistor 121 steady, and accordingly, as a driving signal stabilizing circuit for preventing influence on the driving current Ids due to the deterioration over time of the organic EL element 127 and the property fluctuation of the n-channel type driving transistor 121 (e.g., irregularities and fluctuation such as threshold voltage and mobility and so forth), other well-known various types of circuit can be employed.

Now, with the driving timing according to the present embodiment, the threshold correction period is determined with the overlapped period wherein the detecting transistor 123 and light-emitting control transistor 122 are both turned on based on each of the threshold and mobility correction pulse AZ1 supplied by the threshold and mobility correction scanning unit 114 and the scan driving pulse NDS supplied by the drive scanning unit 105, and in reality, the period itself wherein the light-emitting control transistor 122 is turned on determines the threshold correction period. On the other hand, the mobility correction period is determined with the overlapped period wherein the sampling transistor 125 and light-emitting control transistor 122 are both turned on based on each of the write driving pulse WS supplied by the write scanning unit 104 and the scan driving pulse NDS supplied by the drive scanning unit 105, the mobility correction period is determined with the period after the light-emitting control transistor 122 is turned on until the sampling transistor 125 is turned off, so in reality, the phase difference between the write driving pulse WS and scan driving pulse NDS determines the mobility correction period.

Therefore, even if there is no property irregularities regarding the detecting transistor 123, sampling transistor 125, and light-emitting control transistor 122 within the pixel circuit P, and influence of distance dependency of the wiring resistance and wiring capacitance of the threshold and mobility correction scanning line 114AZ, write scanning line 104WS, and drive scanning line 105DS can be ignored (hereafter, referred to as prerequisites), there is a possibility that the difference of the waveform property due to the property of the output circuit (in general, referred to as the output buffer) provided at the final stage of the write scanning unit 104, drive scanning unit 105, and threshold and mobility correction scanning unit 114 influences the threshold correction period and mobility correction period.

In particular, with the above-mentioned driving timing, the mobility correction period is shorter than the threshold correction period, with regard to the threshold correction period, there are few problems even if there are some irregularities regarding the ON period of the detecting transistor 123, but with regard to the mobility correction period, influence of irregularities is great, so it is important to manage so as not to cause irregularities regarding the phase difference between the write driving pulse WS and scan driving pulse NDS.

The sampling transistor 125 and light-emitting control transistor 122 are both switching transistors of a vertical-scanning system, so the irregularities of the phase difference between the write driving pulse WS and scan driving pulse NDS are caused in increments of row with the above-mentioned prerequisites, and there is concern that the irregularities thereof will be visually recognized as lateral stripe noise. These problems and the improvement techniques thereof will be described below in detail.

<Output Circuit of Vertical Scanning System>

FIG. 5 is a diagram describing the output circuits of the write scanning unit 104 and drive scanning unit 105. As shown in the drawing, the write scanning unit 104 and drive scanning unit 105 are both configured to switch the write scanning line 104WS and drive scanning line 105DS of each row to a high-level state or low-level state to control the respective gate terminals G of one row worth of all the sampling transistors 125 or all the light-emitting transistors 122 all at once. Therefore, at the portions connected to the write scanning line 104WS or drive scanning line 105DS output circuits 400 and 500 having sufficient driving ability are provided. In the drawing, one row worth of the output circuits 400 and 500 alone are illustrated, but the output circuits 400 and 500 are provided as to the write scanning line 104WS and drive scanning line 105DS of each row. The write scanning unit 104 and drive scanning unit 105 are provided at the outer edge (so-called frame portion) of the pixel array unit 102, and though not shown in the drawing, a first potential Vcc_H and second potential Vss_L (Vcc_H>Vss_L) are supplied from a power supply circuit, of which the output impedance is sufficiently small, provided at the outside of the display panel unit 100.

The output circuits 400 and 500 have the same configuration, so description will be made below regarding the output circuit 400 serving as a representative. The output circuit 400 at the write scanning unit 104 side has a configuration wherein a p-channel transistor (p-type transistor) 402, an n-channel transistor (n-type transistor) 404 are serially disposed between a supply terminal 400H for the first potential Vcc_H and a supply terminal 400L for the second potential Vss_L, as an example. The source terminal S of the p-type transistor 402 is connected to the supply terminal 400H for the first potential Vcc_H, and the source terminal S of the n-type transistor 404 is connected to the supply terminal 400L for the second potential Vcc_L. The respective drain terminals D of the p-type transistor 402 and n-type transistor 404 are connected in common, and the connection point thereof is connected to the write scanning line 104WS. A CMOS inverter is configured as a whole.

The respective gate terminals G of the p-type transistor 402 and n-type transistor 404 are connected in common, and the write driving pulse NWS which is in an active-low state is supplied to the connection point thereof. When the write driving pulse NWS is in an active-low state, the n-type transistor 404 is turned off, and also the p-type transistor 402 is turned on, so the first potential Vcc_H is supplied to the write scanning line 104WS, and on the other hand, when the write driving pulse NWS is in an inactive-high state, the p-type transistor 402 is turned off, and also the n-type transistor 404 is turned on, so the second potential Vss_L is supplied to the write scanning line 104WS. On the other hand, with the output circuit 500 at the drive scanning unit 105 side, the respective gate terminals G of the p-type transistor 502 and n-type transistor 504 are connected in common, and the scan driving pulse DS which is in an active-high state is supplied to the connection point thereof. When the scan driving pulse DS is in an inactive-low state, the n-type transistor 504 is turned off, and also the p-type transistor 502 is turned on, so the first potential Vcc_H is supplied to the drive scanning line 105DS, and on the other hand, when the scan driving pulse DS is in an active-high state, the p-type transistor 502 is turned off, and also the n-type transistor 504 is turned on, so the second potential Vss_L is supplied to the drive scanning line 105DS. As can be understood from those operations, the output circuits 400 and 500 serve as inverter-type buffers.

<Mobility Correction Period and Influence of Property Irregularities of Transistor of Output Circuit>

Figure 6:
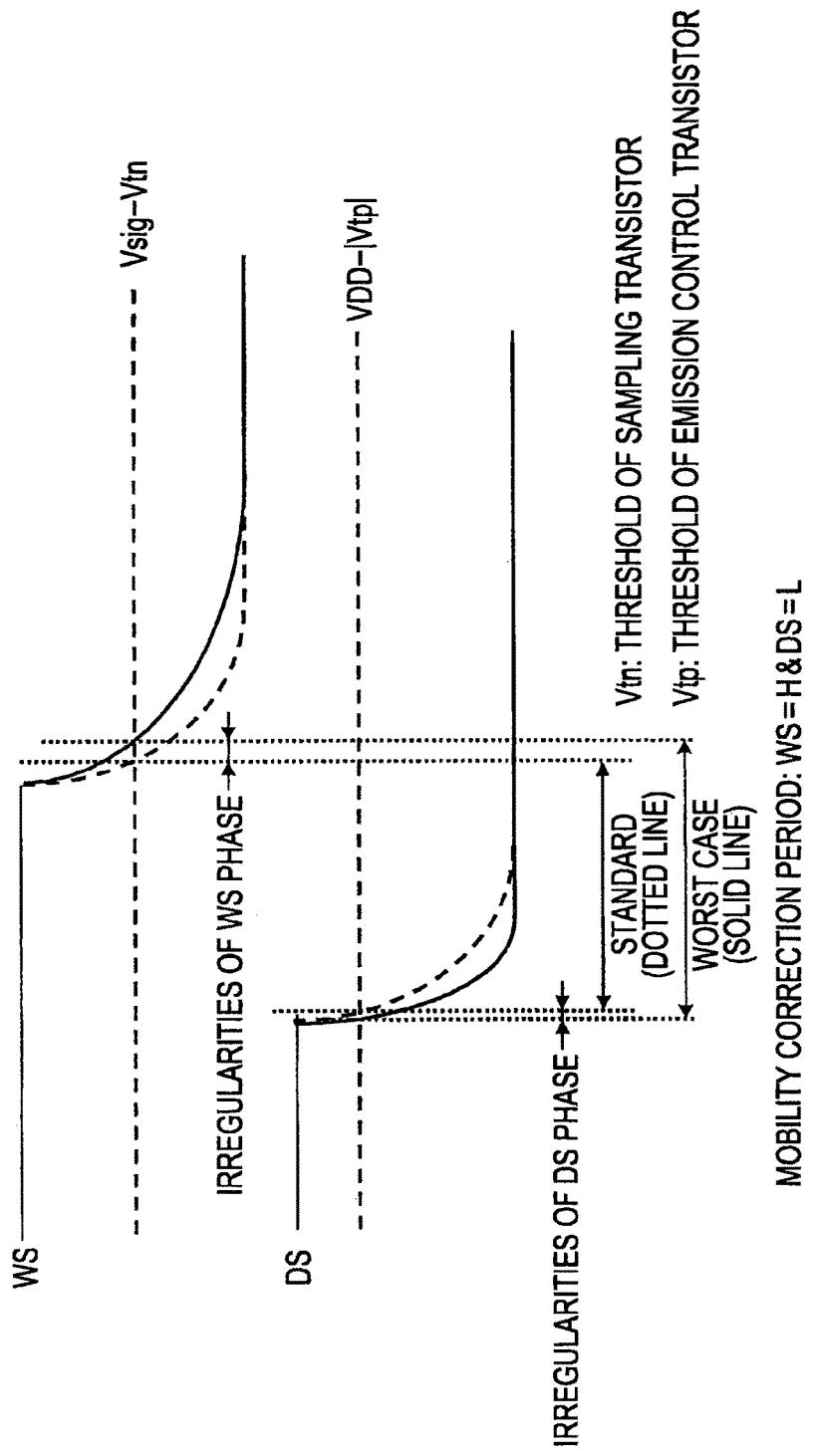
FIG. 6 is a diagram illustrating a first example of the waveform blunting of a correction pulse close to a mobility correction period.
Figure 7:
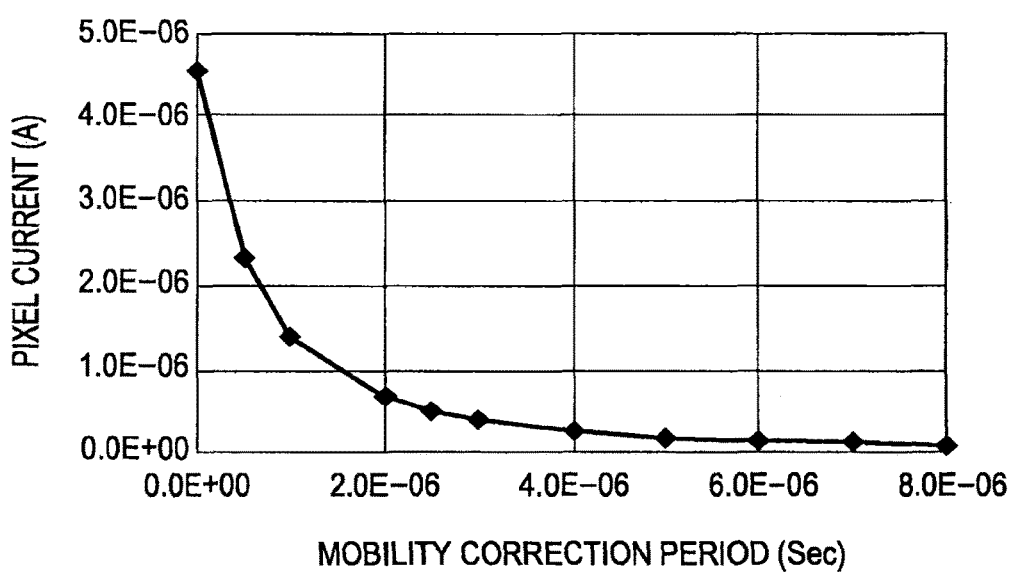
FIG. 7 is a property diagram illustrating the relations between a mobility correction period and a pixel current (driving current)
Figure 8:
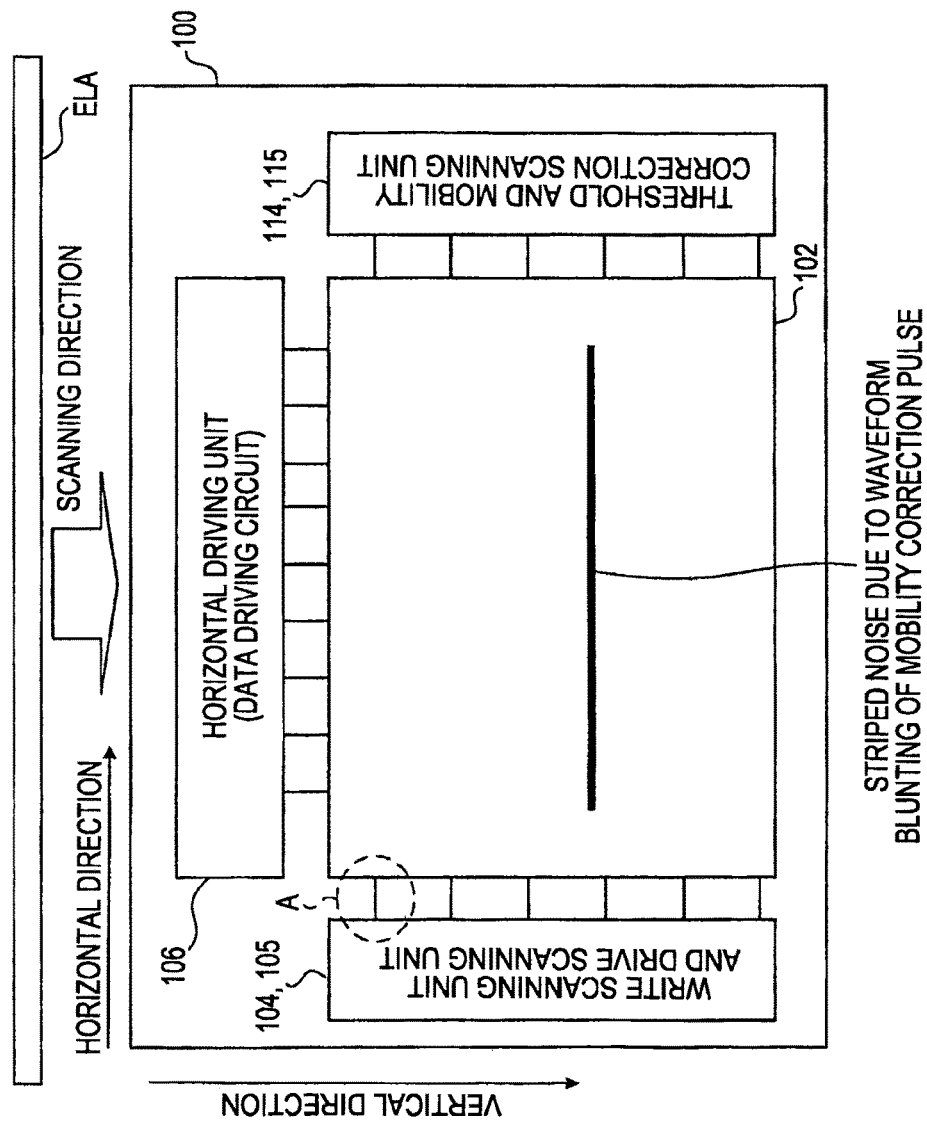
FIG. 8 is a diagram illustrating brightness unevenness due to the irregularities of mobility correction periods due to the irregularities of waveform blunting.
Figure 9:
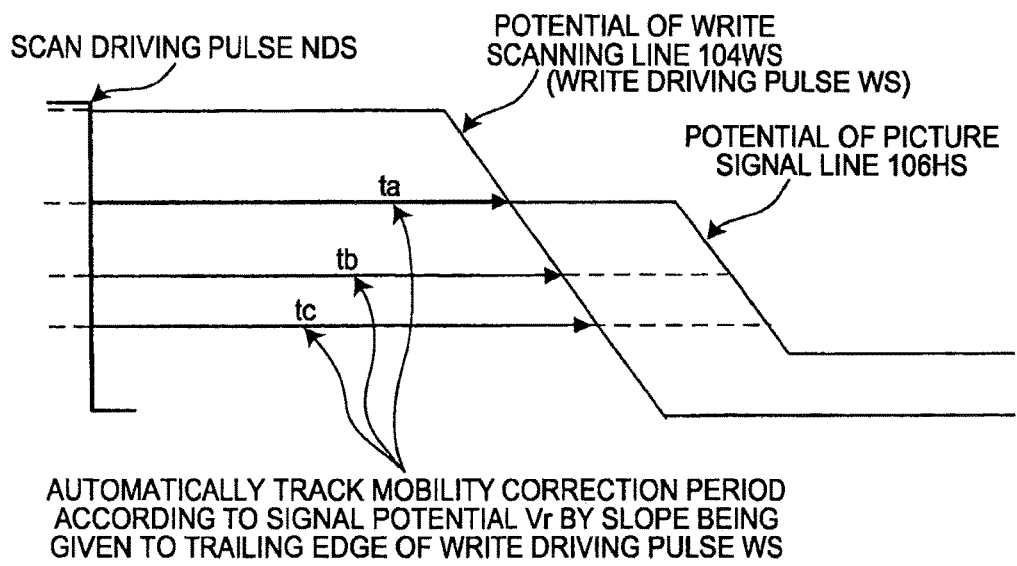
FIG. 9 is a diagram illustrating a second example of the waveform blunting of a correction pulse close to a mobility correction period.
Figure 10:
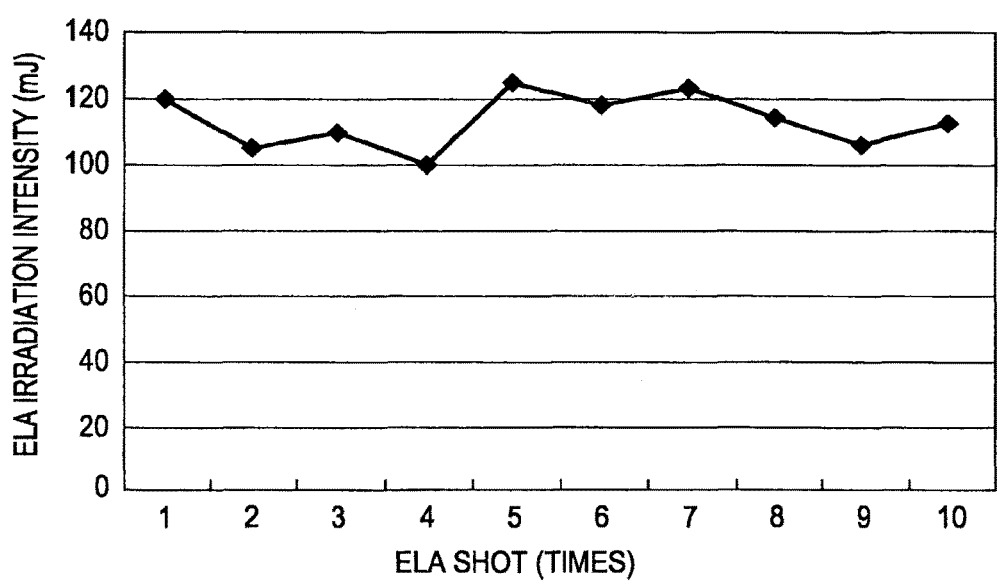
FIG. 10 is a diagram illustrating an example of irradiation intensity irregularities at each time at the time of ELA irradiation.

FIGS. 6 through 10 are diagrams describing an example of waveform blunting of the write driving pulse WS and scan driving pulse NDS around the mobility correction period, and influence due to waveform blunting irregularities given to the mobility correction period. FIG. 6 is a diagram illustrating a first example of waveform blunting of correction pulses (write driving pulse WS and scan driving pulse NDS) around the mobility correction period. FIG. 7 is a property diagram illustrating the relations between the mobility correction period and pixel current (driving current Ids). FIG. 8 is a diagram illustrating an example of brightness unevenness due to mobility correction period irregularities due to the irregularities of waveform blunting. FIG. 9 is a diagram illustrating a second example of waveform blunting of a correction pulse (write driving pulse WS) around the mobility correction period. FIG. 10 is a diagram illustrating an example of irradiation intensity irregularities of each time of ELA irradiation.

As described with FIG. 4, with the pixel circuit P according to the present embodiment and the driving timing thereof, a mobility correction operation is performed at a later half portion of a sampling period. With the driving timing shown in FIG. 4, with a process wherein the light-emitting control transistor 122 is turned on, and the voltage information corresponding to the picture signal Vsig is written in the storage capacitor 120, the mobility correction period is determined with a period after the light-emitting control transistor 122 is turned on until the sampling transistor 125 is turned off, so in reality, the phase difference between the write driving pulse WS and scan driving pulse NDS determines the mobility correction period.

A wire having a high resistance value such as molybdenum Mo or the like is employed for the write scanning line 104WS for the write driving pulse WS, and the drive scanning line 105 DS for the scan driving pulse NDS, and also the overlapped parasitic capacitance thereof is great, so those pulses blunt such as shown in FIG. 6. The waveform blunting of the pulses strongly depends on the buffer property of the output circuits 400 and 500 provided at the final stage of each of the scanning units 104 and 105. Upon the property of each of the transistors 402, 404, 502, and 504 (collectively referred to as "buffer transistor") making up the output circuits 400 and 500 fluctuating, the waveform property of the pulses also fluctuates, and the mobility correction period also fluctuates due to the influence thereof. For example, FIG. 7 illustrates the relations between the mobility correction time and pixel current values, but as can be understood from this drawing, upon mobility correction fluctuating, difference is caused between pixel currents, and brightness irregularities are caused for each row. The longer the mobility correction time is, the weaker and darker the pixel current is, and on the other hand, the shorter the mobility correction time is, the stronger and brighter the pixel current is.

For example, with the relations between the write driving pulse WS and scan driving pulse NDS shown in FIG. 6, the mobility correction time becomes the longest when the trailing edge of the scan driving pulse NDS is the steepest, and also the trailing edge of the write driving pulse WS is the most moderate, and the mobility correction time becomes the shortest when the trailing edge of the scan driving pulse NDS is the most moderate, and also the trailing edge of the write driving pulse WS is the steepest. The former is a worst-case scenario from the perspective of light-emitting brightness.

The lines (horizontal lines) of such a worst case appear as dark stages as compared with the surrounding thereof as shown in FIG. 8 for example, which exhibit lateral stripe noise, and accordingly, the yield falls. A panel having high brightness is expected, and in order to realize this, a short mobility correction period is needed. If the correction period is shortened, stripes due to the correction period irregularities become more marked.

Also, as shown in FIG. 9, the above-mentioned problem is also caused in a case wherein the change property of the write scanning line potential at the side for turning off the sampling transistor 125 is inclined, whereby the mobility correction period automatically follows the picture signal potential (the signal potential Vin of the picture signal Vsig), i.e., if the property irregularities of the buffer transistors making up the output circuits 400 and 500 occur, change property irregularities of the write scanning line potential are also caused, and due to the influence thereof irregularities are also caused with the mobility correction periods.

With the threshold correction, the correction period thereof is longer than the mobility correction period, and moreover, the threshold correction can be performed multiple times, so the irregularities management of the threshold correction period can be performed in a relatively moderate manner. On the other hand, with the mobility correction, the correction period is far shorter than the threshold correction period, and the irregularities thereof appear as change in brightness, so it is necessary to strictly enforce the irregularity management of the mobility correction period thereof.

Now, the cause for the property irregularities of the buffer transistors is the output intensity irregularities at the excimer laser annealing (ELA) processing. That is to say, with an active-matrix-type organic EL panel, a low temperature process employing a polysilicon (poly-Si) substrate is used, and driving circuits such as a TFT and so forth are integrated on a glass substrate. The polysilicon substrate is formed by irradiating the high output pulses of an excimer laser (wavelength is 308 nm), and subjecting an amorphous silicon film to melting, cooling, and solidification. This method is referred to as excimer laser annealing, and high-quality polysilicon across a great area can be obtained at a low temperature.

With the ELA process, scanning is performed with a predetermined irradiation pitch (e.g., in increments of several 10 .mu.m) in one direction on the polysilicon substrate where the display panel unit 100 is formed, on which the pixel array unit 102, and at the outer edge portion thereof the vertical driving unit 103 and horizontal driving unit 106 are mounted, using an excimer laser having predetermined irradiation width.

Note however, as shown in FIG. 10, in general, ELA output irregularities are caused for each irradiation, irradiation intensity irregularities are caused in the scanning direction, and not only the TFTs of the pixel circuits P within the pixel array unit 102 but also the buffer transistors of the output circuits 400 and 500 are readily influenced by ELA irradiation intensity irregularities. This is because the irregularities of crystal grain diameter sizes to be generated are caused due to the output irregularities of the excimer laser.

If ELA irradiation intensity irregularities are caused on the semiconductor substrate in increments of irradiation pitch, there is property difference at each buffer transistor arrayed in the scanning direction, and due to influence of the property difference thereof irregularities in the scanning direction are also caused between the mobility correction periods, and consequently, this brings about a disadvantage wherein such irregularities are readily recognized visually as stripe noise.

That is to say, the irregularities between the mobility correction periods due to the property irregularities of the buffer transistors appear as brightness unevenness. In particular, with low-temperature polysilicon, the excimer laser annealing processing is performed wherein, while irradiating a linear laser (line light) on the semiconductor substrate, scanning is performed in the direction orthogonal to the longitudinal direction of the laser thereof to crystallize, so due to influence of the scanning unevenness (fluctuation such as irradiation width, scanning pitch, scanning speed, irradiation intensity, etc.) at the time of the annealing processing, the property (linear) of a laser beam employed as a light source appears not only as the property irregularities of the respective pixel circuits P of the display panel unit 100 but also as the property irregularities of the scanning units 103 and 106 provided at the outer edge of the pixel array unit 102.

Specifically, at certain scanning times (scanning positions), the semiconductor substrate is irradiated linearly generally with constant and even irradiation intensity, the properties of the buffer transistors making up the respective scanning units 103 and 106 become overall even in the longitudinal direction of the laser beam (line light), but on the other hand, irregularities occur in the scanning direction at the time of the annealing processing. As a result thereof, on the display screen brightness unevenness occurs linearly, which has a constant relation with the scanning direction at the time of the annealing processing, and visually, this is observed as stripe noise. As shown in FIG. 1B, handling for color image display leads to a disadvantage wherein unnecessary coloring (stripped color noise) for each row is visually recognized.

The annealing processing is performed by using a linear laser beam to scan the semiconductor, so there is a feature wherein the property irregularities of the buffer transistors readily appear substantially with a linear correlation, and also there is a tendency wherein even if the level of the property irregularities of the respective buffer transistors is small, this appears on an image as stripe noise, which is readily sensed visually.

Even if the levels of the property irregularities of the transistors are the same, the way a human senses this differs greatly between a case of the irregularities being accumulated linearly and recognized as a stripe pattern, and a case of the irregularities being distributed randomly, and consequently, the case of irregularities being distributed randomly can be naturally accepted as compared with the former case. This is due to human cognitive psychology nature to focus attention on any geometric patterns which can be recognized.

In order to eliminate such a problem, it can be conceived as a first technique to reduce irregularities factors at the time of the annealing processing as much as possible, such as the irradiation width, scanning pitch, scanning speed, irradiation intensity, and so forth of a linear laser beam. Note however, it goes without saying that such measures are limited.

Therefore, with the present embodiment, focusing attention on that the cause of brightness unevenness appeared in stripes on the display screen is the annealing processing for scanning a linear laser beam, the layout configuration (pattern design) of the buffer transistors at the time of forming a semiconductor circuit is devised in light of the irradiation width and scanning pitch at the time of the annealing processing. The present embodiment is the same as an existing method from the perspective of circuits, but takes measures from the perspective of manufacturing.

Specifically, with the scanning direction at the time of the annealing processing, the sizes (particularly, channel width) of the buffer transistors are set to generally the same as the pixel pitch. Note that with regard to the sizes of the buffer transistors, the channel sizes thereof actually have a meaning, so the size of a valid channel width excluding an area which cannot be used as a channel such as electrode wiring or the like is set so as to be generally the same size as the pixel pitch. Hereafter, such a relation is referred to as setting the channel width of the buffer transistors to the same size as the pixel pitch in the scanning direction at the time of the anneal processing. That is to say, the layout configuration is devised from the perspective of channel width such that the buffer transistors for driving one line worth of all the switching transistors are disposed to the maximum extent in the relation with the pixel pitch, whereby influence which the cause of the irregularities at the time of the annealing processing gives to the display screen is alleviated. Description will be made below specifically regarding the pattern design at the time of forming a semiconductor circuit and the aspect of a manufacturing process.

<Improvement Technique: First Basic Example>

Figure 11:
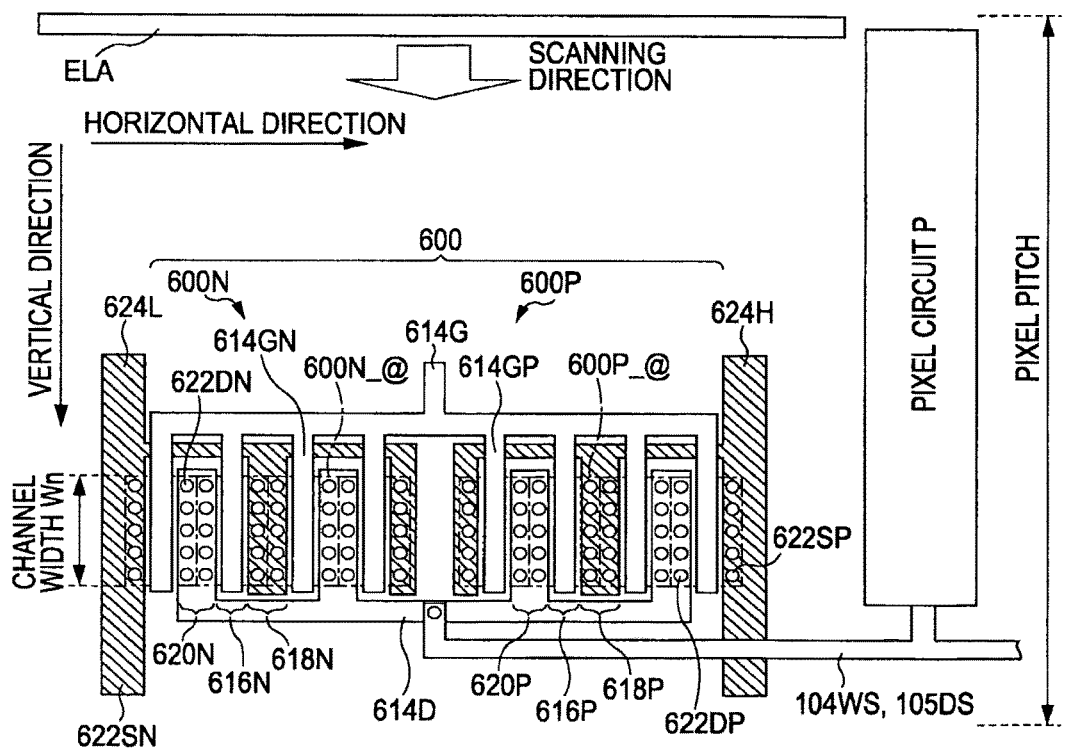
FIG. 11 is a diagram illustrating a comparative example as to the driving circuit placement according to the present embodiment.
Figure 12:
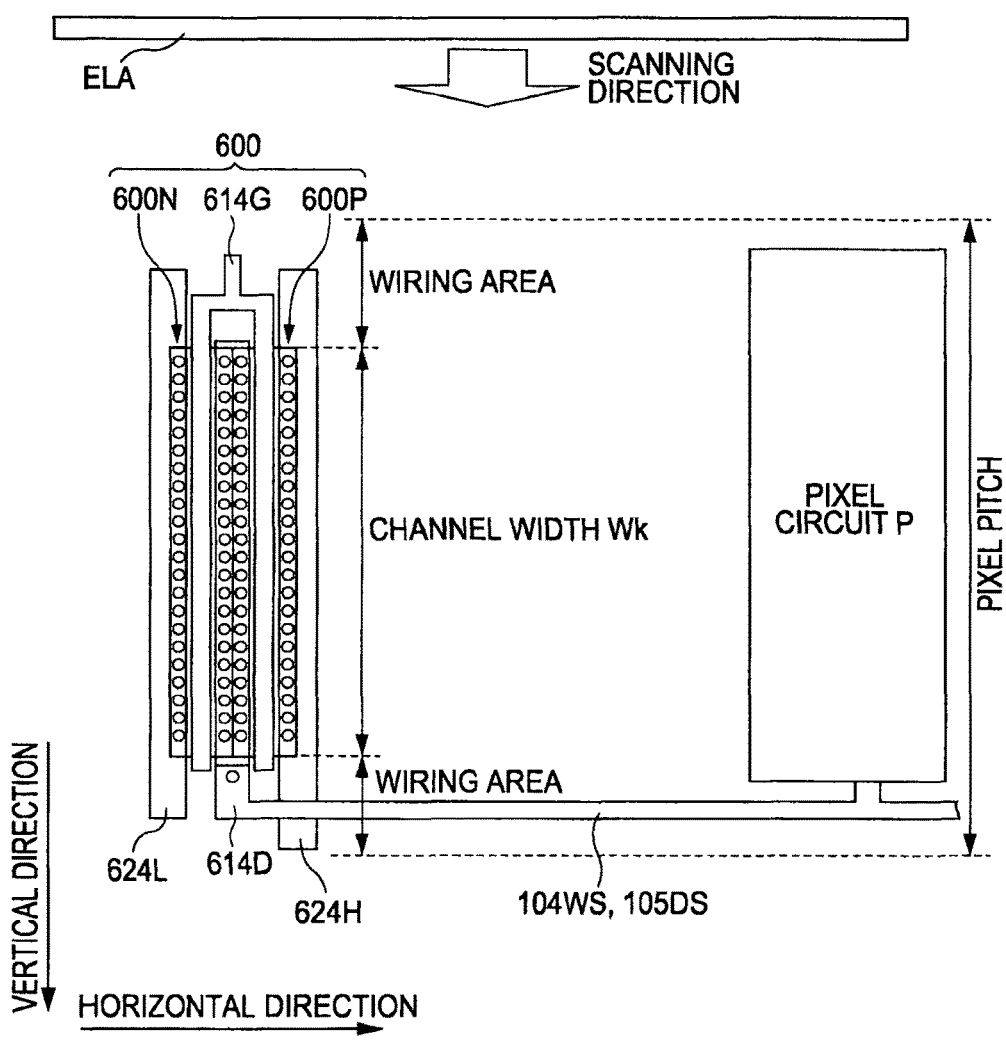
FIG. 12 is a diagram illustrating a first embodiment of the driving circuit placement.

FIG. 11 is a diagram illustrating a comparative example as to the driving circuit placement (layout) according to the present embodiment whereby brightness irregularities on the display screen due to the irregularities cause at the time of the annealing processing can be alleviated. FIG. 12 is a diagram illustrating the driving circuit placement (layout) according to the first embodiment. Both are diagrams focusing attention on the connection portion between the write scanning unit 104, drive scanning unit 105, and pixel circuit P of the portion A in FIG. 8, for example. This can be applied to later-described other embodiments.

In the same way as an existing arrangement, when generating the display panel unit 100 of the organic EL display device 1, a polysilicon substrate is employed to integrate driving circuits on the glass substrate at a low-temperature process. At this time, the ELA method is employed to irradiate the high-output pulse of an excimer laser (wavelength is 308 nm), and subject an amorphous silicon (a-Si) film to melting, cooling, and solidification, thereby performing panel manufacturing.

At this time, with the present embodiment, in order to suppress the irregularities of buffer properties due to ELA irradiation, the channel width W of a buffer transistor is set to the maximum value that can be taken with the relation as to the pixel pitch. In particular, the first embodiment is a first application example in the case of not dividing the channel width W of a buffer transistor (i.e., in the case of not employing a multi-finger configuration), one channel width W of a buffer transistor is set to the maximum value that can be taken with the relation as to the pixel pitch. As for the difference as to a later-described second embodiment, the first embodiment has features in that the channel width W is set so as to be equal to or smaller than the pixel pitch in the ELA scanning direction.

In general, a buffer provided in a scanning unit needs to have sufficient driving ability so as to drive all the switching transistors commonly connected to one scanning line which the buffer thereof drives. The driving ability of the buffer relates to a channel size (buffer size), and the channel size thereof is adjusted with the channel length L in the direction where a current flows or the channel width W orthogonal to the direction where a current flows. In general, when adjusting driving ability, in order to facilitate adjustment of a layout area, a transistor is not employed as a single device, and a multi-finger configuration is employed instead wherein multiple gate electrodes with a predetermined width are disposed in multiple rows, the transistor is divided into small transistors by connecting the corresponding each source and drain mutually, thereby disposing the single transistor effectively within a stipulated area.

For example, like the comparative example shown in FIG. 11, with the p-type transistors 402 and 502 (correctively referred to as 600P), multiple (four, in the present example) gate electrodes 614GP extending in one direction on an unshown n-type substrate are provided mutually in parallel, and the area immediately beneath a gate electrode 614GN provided on the surface of the n-type substrate is a channel area 616P. The areas between the channel areas 616P on the surface of the n-type substrate are source areas 618P or drain areas 620P, and the source areas 618P and drain areas 620P are arrayed alternately. Thus, multiple p-type transistors 600P_@ (@ is 1 through 4; each is also referred to a divided p-type transistor) are formed, the source areas 618P or drain areas 620P are shared between the p-type transistors 600P_1 through _k which are adjacent to each other. Multiple contacts 622SP and 622DP are arrayed in a column in the longitudinal direction of the gate electrode 614GP on the surfaces of the source areas 618P and drain areas 620P, and each contact 622SP of the source areas 618P is connected in common to an electrode 624H for the first potential Vcc_H.

With the n-type transistors 404 and 504 (correctively referred to as 600N) having the same configuration also, multiple (four, in the present example) gate electrodes 614GN extending in one direction on an unshown p-type substrate are provided mutually in parallel, and the area immediately beneath a gate electrode 614GP provided on the surface of the p-type substrate is a channel area 616N. The areas between the channel areas 616N on the surface of the p-type substrate are source areas 618N or drain areas 620N, and the source areas 618N and drain areas 620N are arrayed alternately. Thus, multiple n-type transistors 600N_@ (wherein @ is 1 through 4; each also referred to as a divided n-type transistor) are formed, the source areas 618N or drain areas 620N are shared between the n-type transistors 600N_1 through _k which are adjacent to each other. Multiple contacts 622SN and 622DN are arrayed in a column in the longitudinal direction of the gate electrode 614GN on the surfaces of the source areas 618N and drain areas 620N, and each contact 622SN of the source areas 618N is connected in common to an electrode 624L for the second potential Vss_L.

The gate electrodes 614GP of the p-type transistor 600P, and the gate electrodes 614GN of the n-type transistor 600N are connected in common to a gate electrode 614G, and also the contacts 622DP of the drain areas 620P of the p-type transistor 600P, and the contacts 622DP of the drain areas 620P of the p-type transistor 600P are connected in common to a drain electrode 614D.

With the p-type transistor 600P and n-type transistor 600N (correctively referred to as a buffer transistor 600), the channel width W is generally equivalent to the length in the longitudinal direction of the gate electrodes 614GP and 614GN of the source areas 618P and 618N or the drain areas 620P and 620N, and the channel length L is generally equivalent to the widths of the channel areas 616P and 616N (the length in the direction orthogonal to the longitudinal direction of the gate electrodes 614GP and 614GN).

With the correspondence as to the output circuits 400 and 500 shown in FIG. 5, the write driving pulse NWS is supplied to the gate electrode 614G, and the drain electrode 614D is connected to the write scanning line 104WS or driving scanning line 105DS.

With the buffer transistor 600 having such a multi-finger configuration, an entire channel width Wall can be represented as Wall=n*Wn, when assuming that the channel width W of each divided transistor is Wn, and the number of division is n.

On the other hand, with the configuration of the present embodiment, regardless of whether or not a buffer transistor is divided, in order to set the channel width of a buffer transistor to the same size as the pixel pitch in the scanning direction at the time of the annealing processing, the channel width W of the buffer transistor is set to the maximum (Wk) excluding wiring areas that can be taken according to the relation with the pixel pitch, as to the scanning direction at the time of the annealing processing.

Now, the maximum (Wk) that can be taken according to the relation with the pixel pitch means that when forming a buffer transistor such that the direction of the channel width W is identical to the ELA scanning direction, in the case of forming the buffer transistor so as to include leading-around worth of each electrode of the gate, source, and drain within the pixel pitch, each electrode wiring worth of the gate, source, and drain thereof is not contributed to the channel width W, so except for the electrode wiring worth thereof almost the entire range that can be used as the channel width W is allocated to the channel width W.

With the configuration example of the first embodiment shown in FIG. 12, a configuration where the channel width W of a buffer transistor is not divided, i.e., a multi-finger configuration is not employed, one channel width Wk of the buffer transistor is set to the maximum value (within the range of the pixel pitch) that can be taken according to the relation with the pixel pitch, which is the same buffer size of hundred .mu.m order as the pixel pitch. The respective buffer transistors 600P and 600N in the configuration example of the first embodiment shown in FIG. 12 have the same channel width (and also channel length L) as compared with the respective buffer transistors 600P and 600N of the comparative example shown in FIG. 11, and accordingly, Wall=Wk=n*Wn holds.

Thus, the property of the buffer transistor 600 can be determined with much more ELA irradiation. Consequently, the property commensurate with the average value of ELA irradiation intensity can be obtained, irregularities for each row of the property of the buffer transistor 600 can be suppressed, occurrence of striped noise due to mobility correction period irregularities can be suppressed, and image quality with high uniformity can be obtained.

In the case of employing a multi-finger configuration with an existing arrangement, with regard to the relations between the number of divisions and the channel width W of each divided transistor (divided p-type transistor and divided n-type transistor), only the aspect of driving ability is chiefly taken into consideration. Therefore, like the comparative example shown in FIG. 11, the channel width W of a divided transistor approaches the ELA irradiation pitch, and frequently becomes the same size as the ELA irradiation pitch.

For example, let us assume that the pixel pitch is 100 .mu.m, and the size obtained by dividing 80% of the pixel pitch 100 .mu.m into four equally is the channel width W of each finger (=20 .mu.m). If the ELA irradiation pitch is 10 .mu.m or so, as shown in FIG. 10, the ELA irradiation intensity fluctuates for each shot, so in the case of the comparative example shown in FIG. 11, the property of the buffer transistor is determined with around one-time or two-time ELA irradiation, which causes a problem wherein the property irregularities of the output buffers increases. The property of the buffer transistor 600 of each row is readily influenced by ELA irradiation irregularities, which causes a problem wherein the output irregularities for each row (for each stage) readily occur.

On the other hand, with the layout according to the first embodiment shown in FIG. 12, if we say that the channel width Wk of the buffer transistor 600 is around 100 .mu.m, which is the same as the pixel pitch, and the ELA irradiation pitch is 10 .mu.m or so, the property thereof can be determined with around eight-time ELA irradiation, the ultimate property can be obtained so as to be commensurate with the average value of around four times as to the comparative example, and accordingly, the property difference of the buffer transistors 600 of each row can be extremely suppressed. If the property difference of the buffer transistors 600 of each row can be suppressed, the row irregularities of mobility correction periods can also be suppressed, and accordingly, image quality with high uniformity can be obtained.

Improvement Technique: Second Embodiment

Figure 13A:
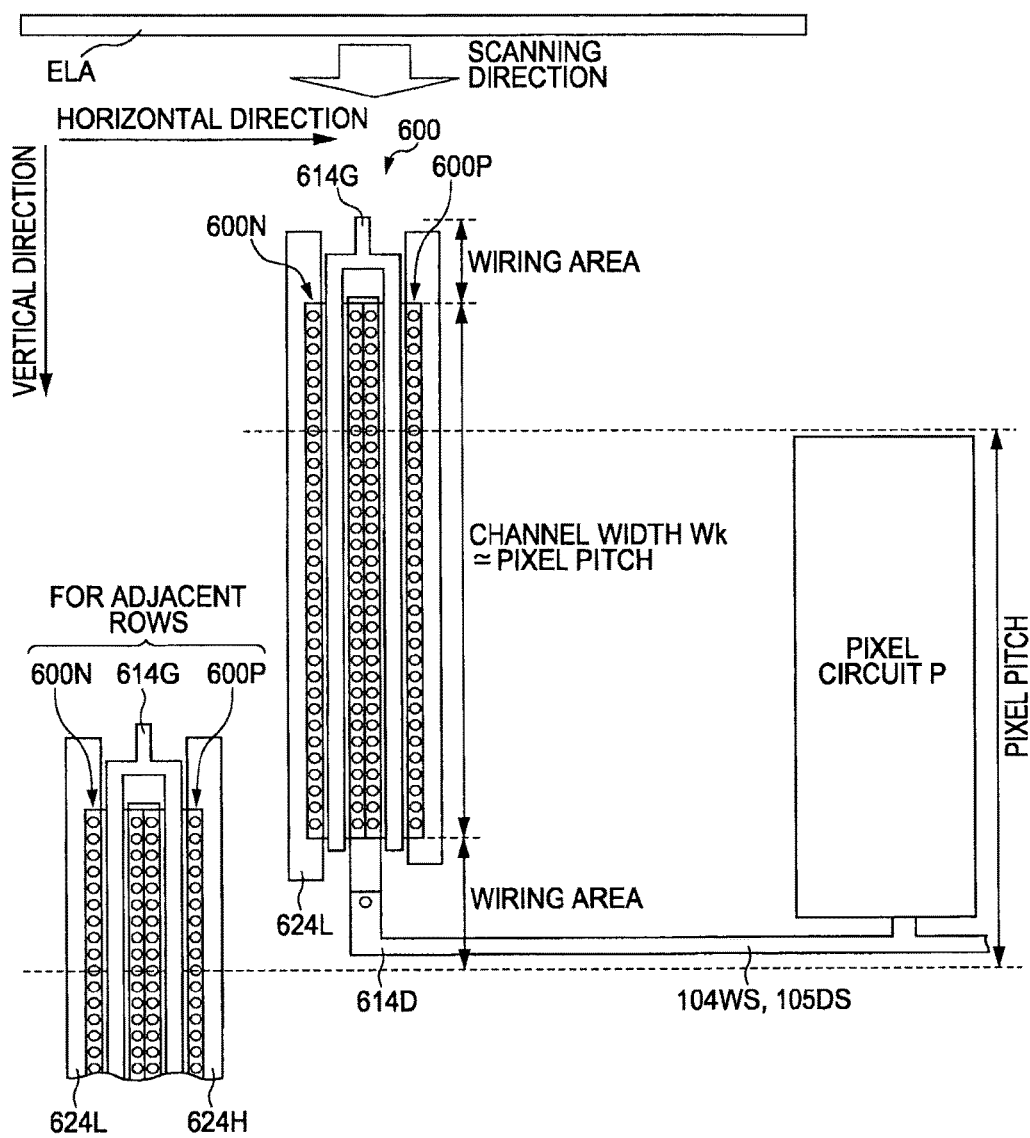
FIG. 13A is a diagram illustrating a second embodiment (first example) of the driving circuit placement.
Figure 13B:
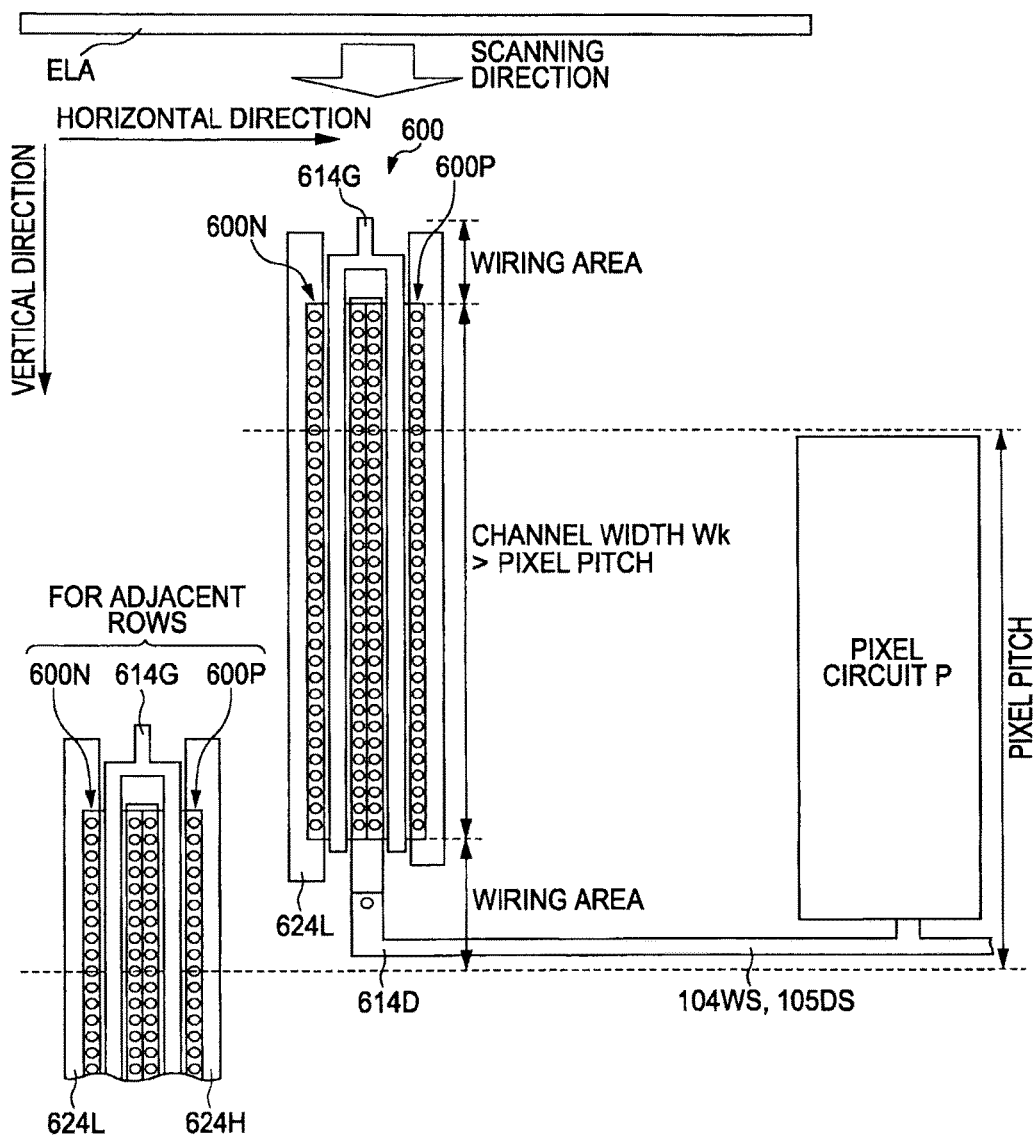
FIG. 13B is a diagram illustrating the second embodiment (second example) of the driving circuit placement.

FIGS. 13A and 13B are diagrams illustrating a second embodiment of the driving circuit placement (layout) whereby brightness irregularities on the display screen due to the irregularities cause at the time of the annealing processing can be alleviated. The layout of the buffer transistor 600 according to the second embodiment is a second application example in the case of not dividing the channel width W (i.e., in the case of not employing a multi-finger configuration), wherein one channel width Wk of a buffer transistor is set to the maximum value that can be taken according to the relation with the pixel pitch. As for the difference with the above-mentioned first embodiment, the present embodiment is an application example as to a case wherein there is a need to set the channel width Wk identically to or greater than the pixel pitch.

In either example of the first example shown in FIG. 13A and the second example shown in FIG. 13B, the buffer transistor 600 of each row is not divided. With the first example shown in FIG. 13A, the channel width Wk thereof is set almost identically to the pixel pitch. On the other hand, with the second example shown in FIG. 13B, the channel width Wk is further extended in the vertical direction, and the channel width Wk thereof is set more greatly than the pixel pitch in the ELA scanning direction (around 1.1 times).

In those cases, in order to secure the channel width Wk identically to or more greatly than the pixel pitch, the buffer transistor 600 of each row includes a portion protruding toward the adjacent row (there are a case including a wiring area alone, and a case of further including the channel width Wk), and accordingly, the buffer transistor 600 is laid out so as to extend over the adjacent row (adjacent stage). Upon such a situation being arrayed in a column, the vertical direction sizes of the threshold and mobility correction scanning unit 114 and threshold and mobility correction scanning unit 115 become extremely great as compared with the vertical direction size of the pixel array unit 102. Therefore, it is desirable to dispose such a portion protruding toward the adjacent row so as to be alternate as the relation with the adjacent row. Thus, the vertical direction sizes of the threshold and mobility correction scanning unit 114 and threshold and mobility correction scanning unit 115 can be set almost identically to the vertical direction size of the pixel array unit 102.

At this time, as shown in the drawing, it is desirable in light of the wiring layout between the drain electrode 614D and the write scanning line 104WS or drive scanning line 105DS to perform layout so as to extend the write scanning line 104WS or drive scanning line 105DS from the drain electrode 614D as is in the row direction by disposing the drain electrode 614D of the buffer transistor 600 within the corresponding row, and so as to protrude the gate electrode 614G side against the adjacent row (adjacent stage) side. It goes without saying that though not shown in the drawing, layout may be performed so as to protrude both of the respective wiring areas of the gate electrode 614G and drain electrode 614D against the adjacent row side.

With the layout according to the second embodiment, the channel width Wk of the buffer transistor 600 is equal to or greater than the pixel pitch, so the property thereof can be determined with much more ELA irradiation than the first embodiment, and accordingly, the property difference of the buffer transistors 600 of each row can be suppressed as compared with the first embodiment. Of course, driving ability is increased as compared with the first embodiment.

Improvement Technique: Third Embodiment

Figure 14:
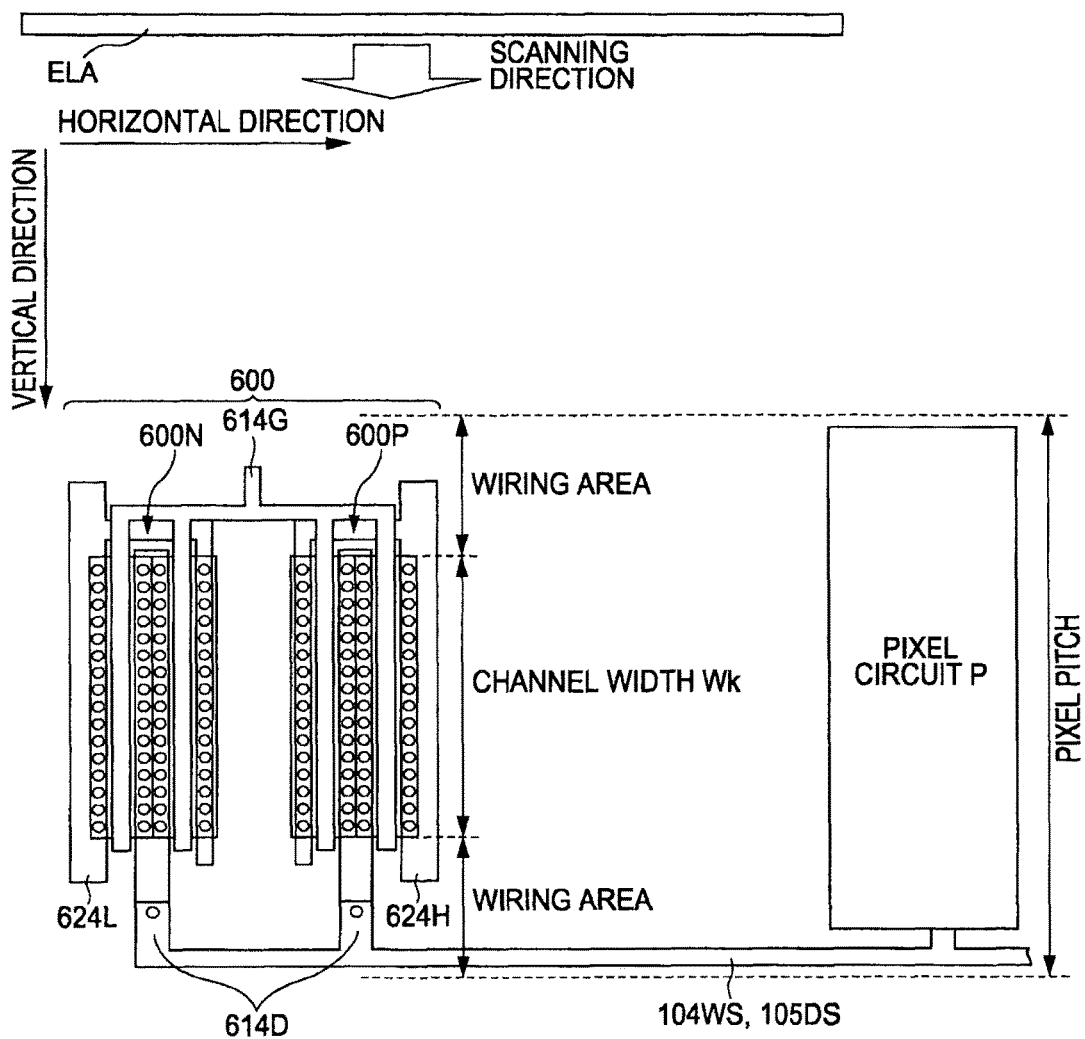
FIG. 14 is a diagram illustrating a third embodiment of the driving circuit placement.

FIG. 14 is a diagram illustrating a third embodiment of the driving circuit placement (layout) whereby brightness irregularities on the display screen due to the irregularities cause at the time of the annealing processing can be alleviated. The layout of the buffer transistor 600 according to the third embodiment is an application example in the case of dividing the channel width Wall (i.e., in the case of employing a multi-finger configuration), and in this case also, one channel width Wk of a buffer transistor is set to the maximum value that can be taken according to the relation with the pixel pitch.

That is to say, in a case wherein there is a need to set the channel width Wall identically to or greater than the pixel pitch in the ELA scanning direction, as shown in FIG. 14, the gate electrodes 614GP and 614GN are divided to employ a multi-finger configuration, but each change width Wk of the divided transistors is set to the maximum value that can be taken according to the relation with the pixel pitch so as to suppress the number of divisions necessary for the entire channel width Wall to the minimum. The reason to suppress the number of divisions necessary for the entire channel width Wall to the minimum is to prevent excessive effects as to required performance. For example, if we say that the channel width of one divided transistor that can be taken as to necessary entire channel width Wall, number of divisions N, and the pixel pitch P in the ELA scanning direction, it is desirable to satisfy (N−1)*Wk<Wall.1toreq.N*Wk.

With the layout according to the third embodiment, in the case of employing a multi-finger configuration as well, the channel width of each divided transistor is set to the maximum value Wk that can be taken according to the relation with the pixel pitch, so with each of the divided transistors, in the same way as with the first embodiment, the property commensurate with the average value of much ELA irradiation can be determined, and accordingly, the property difference of the buffer transistors 600 of each row can be extremely suppressed. Additionally, employing a multi-finger configuration enables the property commensurate with the average value of the ELA irradiation of the divided transistors to be determined as a whole, and accordingly, the ultimate property can be suppressed as compared with the first or second embodiment. Of course, driving ability is increased as compared with the first or second embodiment.

Note that though not shown in the drawing, with the third embodiment employing a multi-finger configuration as well, the channel width Wk of each the divided transistors can be set identically to or more greatly than the pixel pitch in the ELA scanning direction by employing the arrangement according to the second embodiment. Thus, the property difference of the buffer transistors 600 of each row can be suppressed further extremely. Of course, driving ability is further increased.

Pixel Circuit: Second Embodiment

Figure 15A:
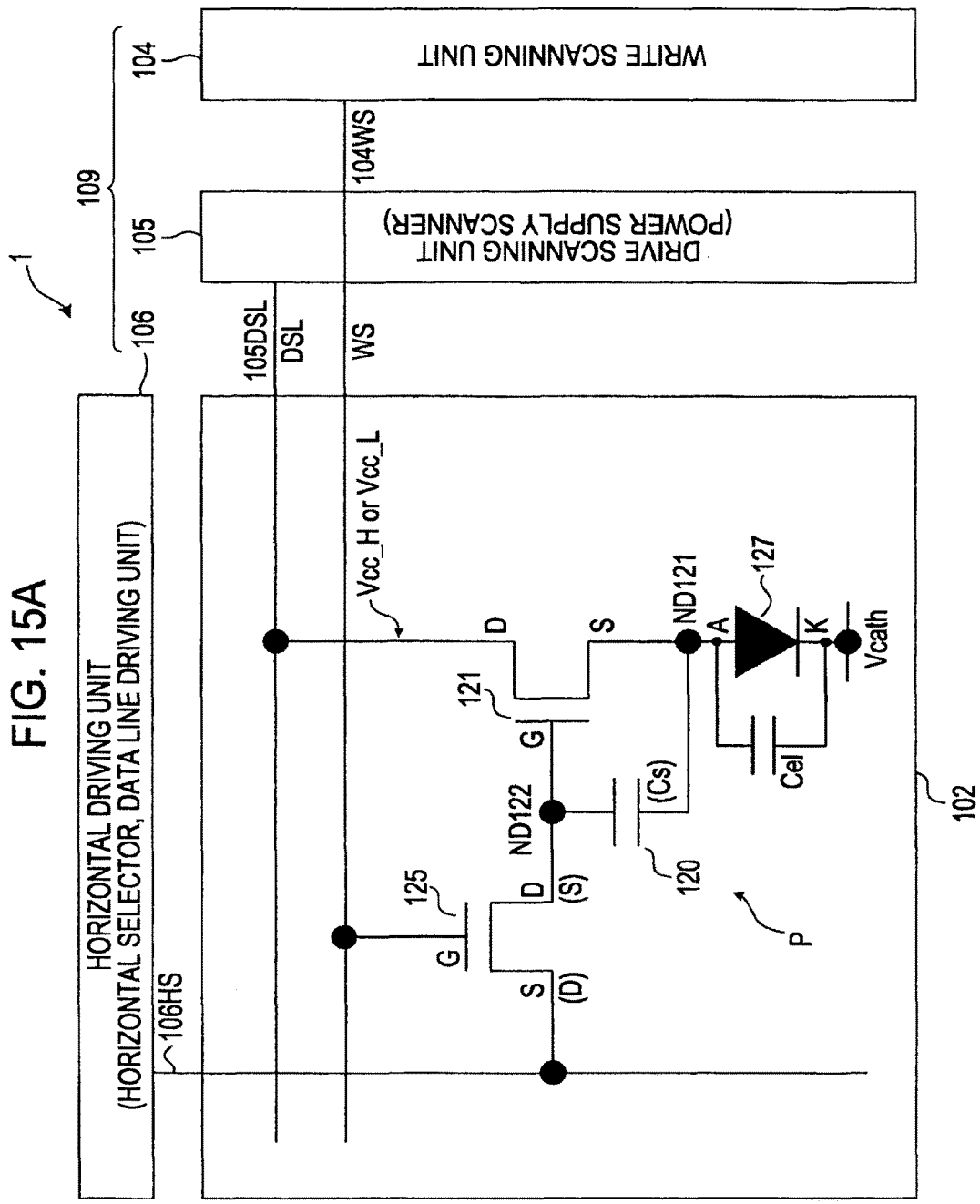
FIG. 15A is a diagram illustrating a second embodiment of the pixel circuit.

FIG. 15A is a diagram illustrating a second embodiment of the pixel circuits P. Note that FIG. 15A also illustrates the vertical driving unit 103 and horizontal driving unit 106 provided on the peripheral portion of the pixel circuits P on the substrate 101 of the display panel unit 100.

The pixel circuit P according to the second embodiment has features in that a two-transistor driving configuration is employed, which uses another switching transistor for scanning (sampling transistor 125) as well as the driving transistor 121, and also according to the ON/OFF settings of the power supply driving pulse DSL for controlling the respective switching transistors and the write driving pulse WS, influence on the driving current Ids is prevented, which is caused due to deterioration over time of the organic EL element 127 or property fluctuation (e.g., irregularities or fluctuation of threshold voltage or mobility or the like) of the driving transistor 121. Also, with the two-transistor driving configuration, the number of devices and the number of wirings are small, whereby a highly fine configuration can be realized, and also sampling can be performed without deterioration in the picture signal Vsig, whereby good image quality can be obtained.

First, in the same way as with the first embodiment, the storage capacitor 120 is connected between the gate and source of the driving transistor 121 to make up a bootstrap circuit which is an example of a driving signal stabilizing circuit as a circuit for preventing driving current fluctuation due to deterioration over time of the organic EL element 127. As for a method for suppressing influence on the driving current Ids, which is caused due to property fluctuation (e.g., irregularities or fluctuation of threshold voltage or mobility or the like) of the driving transistor 121, this can be handled by devising the driving timing of each of the transistors 121 and 125.

Specifically, the pixel circuit P according to the second embodiment includes the storage capacitor 120, n-channel type driving transistor 121, n-channel type sampling transistor 125 to which the active-high write driving pulse WS is supplied, and organic EL element 127 which is an example of an electro-optic element (light-emitting element) which emits light by a current being applied thereto.

The storage capacitor 120 is connected between the gate terminal G (node ND122) and source terminal S of the driving transistor 121, and the source terminal S of the driving transistor 121 is directly connected to the anode terminal A of the organic EL element 127. The cathode terminal K of the organic EL element 127 is assumed to be a cathode potential Vcath serving as a reference potential. The cathode potential Vcath is connected to a ground wiring Vcath (GND) common to all the pixels for supplying the reference potential.

The drain terminal D of the driving transistor 121 is connected to the power supply line 105DSL from the drive scanning unit 105 serving as a power supply scanner. The power supply line 105DSL has features in that the power supply line 105DSL itself has power supply ability as to the driving transistor 121. Specifically, the drive scanning unit 105 according to the second embodiment includes a power supply voltage switching circuit for switching the first potential Vcc_H at the high-voltage side and the second potential Vcc_L at the low-voltage side which are equivalent to power supply voltage to supply this to the drain terminal D of the driving transistor 121.

As for the second potential Vcc_L, potential sufficiently lower than the reference potential Vo of the picture signal Vsig in the picture signal line 106HS is employed. For example, the second potential Vcc_L which is the low potential side of the power supply line 105DSL is set such that the voltage Vgs between the gate and source (difference between the gate potential Vg and source potential Vs) of the driving transistor 121 is greater than the threshold voltage Vth of the driving transistor 121. Note that the reference potential Vo is also employed for an initializing operation prior to a threshold correction operation, and employed for pre-charging the picture signal line 106HS beforehand.

With the sampling transistor 125, the gate terminal G is connected to the write scanning line 104WS from the write scanning unit 104, the source terminal S is connected to the picture signal line 106HS, and the drain terminal D is connected to the gate terminal G (node ND122) of the driving transistor 121. The active-high write driving pulse WS from the write scanning unit 104 is supplied to the gate terminal G thereof. With the sampling transistor 125, a connection mode can also be employed wherein the source terminal S and drain terminal D are inverted.

Operation of Pixel Circuit: Second Embodiment

Figure 15B:
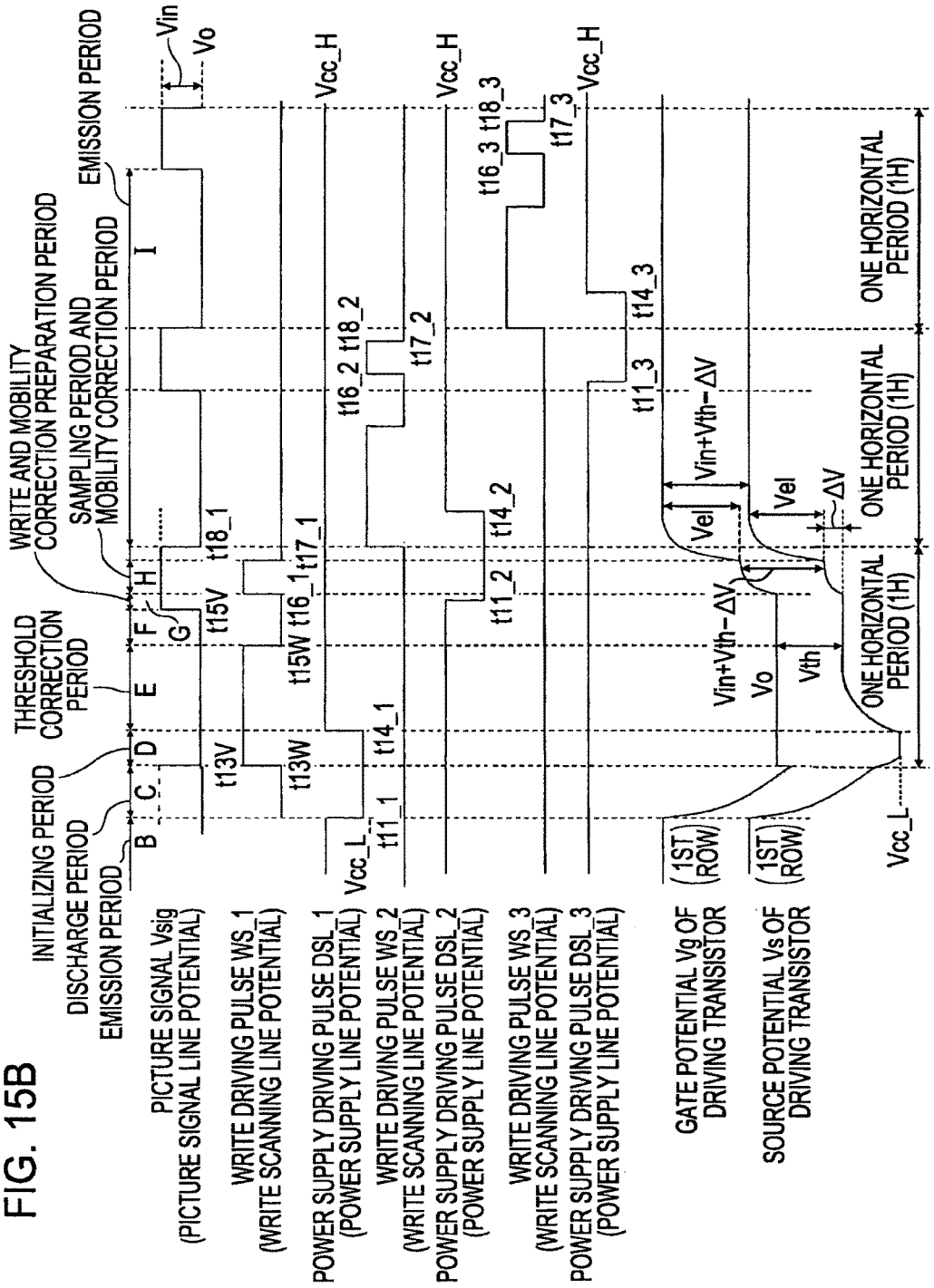
FIG. 15B is a timing chart describing the operation of the pixel circuit according to the second embodiment.

FIG. 15B is a timing chart describing an operation at the time of writing the information of the signal potential Vin in the storage capacitor 120 using a line sequential system, as an example of driving timing relating to the pixel circuit P according to the second embodiment shown in FIG. 15A.

With the pixel circuit P according to the second embodiment, as for driving timing, first, the sampling transistor 125 is electrically conducted in response to the write driving pulse WS supplied from the write scanning line 104WS, samples the picture signal Vsig supplied from the picture signal line 106HS to hold this in the storage capacitor 120. This point is basically the same as that in the case of driving the pixel circuit P according to the first embodiment. Note that with the driving timing according to the pixel circuit P according to the second embodiment, when writing the information of the signal potential Vin of the picture signal Vsig in the storage capacitor 120, from the perspective of sequential scanning, line sequential driving is performed, which propagates one row worth of the picture signal to each column of the picture signal line 106HS simultaneously.

The driving transistor 121 flows the driving current Ids to the organic EL element 127 in accordance with the signal potential (potential corresponding to the potential of the valid period of the picture signal Vsig) which receives current supply from the power supply line 105DSL which is the first potential (high potential side) and held in the storage capacitor 120.

The vertical driving unit 103 outputs the write driving pulse WS as a control signal for electrically conducting the sampling transistor 125 at a time zone wherein the power supply line 105DSL is at the first potential, and also the picture signal 106HS is at the reference potential Vo which is the invalid period of the picture signal Vsig, and holds the voltage equivalent to the threshold voltage Vth of the driving transistor 121 in the storage capacitor 120. This operation realizes the threshold correction function. According to this threshold correction function, influence of the threshold voltage Vth of the driving transistor 121 which fluctuates for each pixel circuit P can be cancelled.

In particular, with the driving timing according to the pixel circuit P according to the second embodiment, the write driving pulse WS is activated within a time zone wherein the power supply line 105DSL is at the first potential which is the high potential side, and also the picture signal Vsig is in a valid period. That is to say, as a result thereof, the mobility correction period (and also sampling period) is determined with a range wherein the time width where the potential of the picture signal line 106HS is at the potential (signal line potential) of the valid period of the picture signal Vsig, and the active period of the write driving pulse WS are overlapped. Particularly, with the present embodiment, the active period width of the write driving pulse WS is set short so as to be included in the time width where the picture signal line 106HS is at the signal potential, and consequently, the mobility correction period is determined with the write driving pulse WS itself. More accurately, the mobility correction period (and also sampling period) is a period after the write driving pulse WS rises to turn on the sampling transistor 125 until the write driving pulse WS falls to turn off the sampling transistor 125.

Description will be made specifically below. First, basically, similar driving is performed with delay of one horizontal scanning period for each row of the write scanning line 104WS or power supply line 105DSL. Each timing and signal in FIG. 15B are shown with the same timing and signal as the timing and signal of the first row regardless of a row to be processed. When there is a need to distinguish rows during explanation, distinction is made by indicating a row to be processed using a reference identifier with an underbar.

With regard to a certain row (first row, here), at a light-emitting period B of the previous field before timing t11, the write driving pulse WS is in an inactive-low state, and the sampling transistor 125 is in a non electroconductive state, but on the other hand, the power supply driving pulse DSL is at the first potential Vcc_H which is the power supply voltage side of a high potential. Accordingly, regardless of the potential of the picture signal line 106HS, the driving current Ids is supplied from the driving transistor 121 to the organic EL element 127 in accordance with the voltage state (the voltage Vgs between the gate and source of the driving transistor 121) held in the storage capacitor 120 according to the operation of the previous field, and applied to the ground wiring Vcath (GND) common to all the pixels, whereby the organic EL element 127 is in a light-emitting state.

Subsequently, the timing chart enters a new field for line sequential scanning, first, in a state in which the write driving pulse WS is in an inactive-low state, the drive scanning unit 105 switches the power supply driving pulse DSL_1 given to the power supply line 105DS_1 of the first row from the first potential Vcc_H which is the high potential side to the second potential Vcc_L which is the low potential side. This timing (t11_1) is assumed to be within a period wherein the picture signal Vsig is at the signal potential Vin of a valid period, with the arrangement shown in FIG. 15B. For example, the first row is in a range of timing t15V through t13V. Note however, this is not indispensable, the above-mentioned switching may be performed when the picture signal Vsig is at the reference potential Vo of an invalid period. The first row may be within a range of timing t13V through t15V.

Next, the write scanning unit 104 switches the write driving pulse WS to an active-high state, while keeping a state in which the power supply line 105DSL_1 is at the second potential Vcc_L (t13W). This timing (t13W) is set to the same timing (t13V) or a little later timing for the picture signal Vsig being switched from the signal potential Vin which is a valid period to the reference potential Vo which is an invalid period after the picture signal Vsig in the last horizontal period is switched from the reference potential Vo which is an invalid period to the signal potential Vin which is a valid period (t15V). Subsequently, the timing for switching the write driving pulse WS to an inactive-low state (t15W) is set to the same timing (t15V) or a little earlier timing for the picture signal Vsig being switched from the reference potential Vo which is an invalid period to the signal potential Vin which is a valid period.

That is to say, it is desirable that a period for keeping the write driving pulse WS in an active-high state (t13W through t15W) is within a time zone where the picture signal Vsig is at the reference potential Vo which is an invalid period (t13V through t15V). This is because when the power supply line DSL is at the first potential Vcc_H, and also the picture signal Vsig is at the signal potential Vin, if the write driving pulse WS is set to an active-high state, a sampling operation (signal potential writing operation) of the signal potential Vin to the storage capacitor 120 is performed, and consequently, inconvenience is caused as an threshold correction operation.

During timing t11_1 through t13W (referred to as a discharge period), the potential of the power supply line 105DSL is discharged up to the second potential Vcc_L, and further, the source potential Vs of the driving transistor 121 makes the transition to the potential close to the second potential Vcc_L. Further, the storage capacitor 120 is connected between the gate terminal G and source terminal S of the driving transistor 121, and according to the effects by the storage capacitor 120 thereof, the gate potential Vg is linked with fluctuation of the source potential Vs of the driving transistor 121. It is desirable that in the case of the wiring capacity of the power supply line 105DSL being great, the power supply line 105DSL is switched from the high potential Vcc_H to the low potential Vcc_L at relatively earlier timing. Sufficiently securing this discharge period C (t11_1 through t13W) prevents influence of wiring capacity or the other pixel parasitic capacitance.

Upon the write driving pulse WS being switched to an active-high state while keeping the power supply driving pulse DSL at the second potential Vcc_L which is the low potential side (t13W), the sampling transistor 125 goes to an electroconductive state. At this time, the picture signal line 106HS is at the reference potential Vo. Accordingly, the gate potential Vg of the driving transistor 121 becomes the reference potential Vo of the picture signal line 106HS through the electroconducted sampling transistor 125. Simultaneously therewith, upon the driving transistor 121 being turned on, the source potential Vs of the driving transistor 121 is immediately fixed to the second potential Vcc_L which is the low potential side.

That is to say, the potential of the power supply line 105DSL is switched to the second potential Vcc_L which is sufficiently lower than the reference potential Vo of the picture signal line 106HS from the first potential Vcc_H which is the high potential side, whereby the source potential Vs of the driving transistor 121 is initialized (reset) to the second potential Vcc_L which is sufficiently lower than the reference potential Vo of the picture signal line 106HS. Thus, the gate potential Vg and source potential Vs of the driving transistor 121 are initialized, whereby the preparation for a threshold correction operation is completed. A period until the power supply driving pulse DSL is next switched to the first potential Vcc_H which is the high potential side (t13W through t14_1) becomes an initializing period D. Note that the conjunction of the discharge period C and initializing period D will also be referred to as a threshold correction preparation period for initializing the gate potential Vg and source potential Vs of the driving transistor 121.

Next, the power supply driving pulse DSL given to the power supply line 105DSL is switched to the first potential Vcc_H while keeping the write driving pulse WS in an active-high state (t14_1). Thereafter, the drive scanning unit 105 keeps the potential of the power supply line 105DSL at the first potential Vcc_H until the next frame (or field) processing. Thus, the timing chart enters a threshold correction period E wherein the drain current flows to the storage capacitor 120, and the threshold voltage Vth of the driving transistor 121 is corrected (cancelled). This threshold correction period E continues until timing for the write driving pulse WS being set to an inactive-low state (t15W).

With the threshold correction period E at timing (t14_1) and thereafter, the potential of the power supply line 105DSL makes the transition from the second potential Vcc_L which is the low potential side to the first potential Vcc_H which is the high potential side, whereby the source potential Vs of the driving transistor 121 starts to increase. That is to say, the gate terminal G of the driving transistor 121 is held at the reference potential Vo of the picture signal Vsig, and the drain current attempts to flow until the driving transistor 121 is cut off by the potential Vs of the source terminal S increasing. Upon being cut off, the source potential Vs of the driving transistor 121 becomes "Vo−Vth".

Note that at the threshold correction period E, in order to entirely apply the drain current to the storage capacitor 120 side (at the time of Cs<<Cel), and prevent the drain current from flowing to the organic EL element 127 side, the potential Vcath of the common ground wiring cath is set such that the organic EL element 127 is cut off. The equivalent circuit of the organic EL element 127 is represented with a parallel circuit of a diode and the parasitic capacitor Cel, so as long as "Vel.1toreq.Vcath+VthEL" holds, i.e., as long as the leak current of the organic EL element 127 is considerably smaller than the current to the driving transistor 121, the current of the driving transistor 121 is employed for charging the storage capacitor 120 and parasitic capacitor Cel.

As a result thereof, upon the current path of the drain current flowing to the driving transistor 121 being cut off, the voltage Vel of the anode terminal A of the organic EL element 127, i.e., the potential of the node ND121 increases over time. Subsequently, upon the potential difference between the potential (source potential Vs) of the node ND121 and the voltage (gate potential Vg) of the node ND122 becoming just the threshold voltage Vth, the driving transistor 121 makes the transition to an OFF state from an ON state, the drain current is prevented from flowing, and the threshold correction period ends. That is to say, after a certain period of time, the voltage Vgs between the gate and source of the driving transistor 121 takes the value of the threshold voltage Vth.

Here, in reality, the voltage equivalent to the threshold voltage Vth is written in the storage capacitor 120 connected between the gate terminal G and source terminal S of the driving transistor 121. Note however, the threshold correction period E is from timing wherein the write driving pulse WS is set to an active-high state (t13W) (specifically, subsequently, time point t14 wherein the power supply driving pulse DSL is returned to the first potential Vcc_H) to timing wherein the write driving pulse WS is returned to an inactive-low state (t15W), and when this period is not secured sufficiently, the threshold correction operation ends before then. In order to eliminate this problem, it is desirable to repeat the threshold correction operation multiple times. The drawings omit the timing thereof.

Next, the drive scanning unit 105 switches the write driving pulse WS to an inactive-low state at a later portion of one horizontal cycle (t15W), and further, the horizontal driving unit 106 switches the potential of the picture signal line 106HS from the reference potential Vo to the signal potential Vin (t15V). Thus, at the timing t15W through t15V, in a state in which the picture signal line 106HS is at the reference potential Vo, the potential of the write scanning line WS (write driving pulse WS) goes to a low-level state. Subsequently, the period wherein the signal potential Vin of the picture signal Vsig is actually supplied to the picture signal line 106HS by the horizontal driving unit 106 to set the write driving pulse WS to an active-high state is taken as the writing period (also referred to as the sampling period) of the signal potential Vin to the storage capacitor 120. This signal potential Vin is held in the form of being added to the threshold voltage Vth of the driving transistor 121.

As a result thereof, fluctuation of the threshold voltage Vth of the driving transistor 121 is constantly cancelled out, which is equivalent to performing threshold correction. According to this threshold correction, the voltage Vgs between the gate and source held in the storage capacitor 120 becomes "Vsig+Vth"="Vin+Vth". Also, simultaneously, at this sampling period mobility correction is carried out. That is to say, at the driving timing at the pixel circuit P according to the second embodiment, the sampling period also serves as the mobility correction period.

Specifically, first, following the write driving pulse WS being switched to an inactive-low state (t15W), the horizontal driving unit 106 further switches the potential of the picture signal line 106HS from the reference potential Vo to the signal potential Vin (t15V). Thus, in a state in which the sampling transistor 125 is set to a non-electroconductive (OFF) state, the preparation for the next sampling operation and mobility correction operation is completed. The period until the timing wherein the write driving pulse WS is next set to an active-high state (t16_1) is referred to as a write and mobility correction preparation period G.

Next, while the potential of the power supply line 105DSL is kept at the first potent Vcc_H, and also the potential of the picture signal line 106HS is kept at the signal potential Vin, the write scanning unit 104 switches the write driving pulse WS to an active-high state (t16_1), and switches the write driving pulse WS to an inactive-low state at suitable timing until the timing wherein the horizontal driving unit 106 switches the potential of the picture signal line 106HS from the signal potential Vin to the reference potential Vo (t18_1), i.e., at the suitable time within a time zone where the picture signal line 106HS is at the signal potential Vin (t17_1). The period wherein the write driving pulse WS is in an active-high state (t16_1 through t17_1) is referred to as a sampling period and mobility correction period H. Thus, in a state in which the gate potential Vg of the driving transistor 121 is at the signal potential Vin, the sampling transistor 125 goes to an electroconductive (ON) state. Accordingly, at the sampling period and mobility correction period H, in a state in which the gate terminal G of the driving transistor 121 is fixed to the signal potential Vin of the picture signal Vsig, the driving current Ids flows to the driving transistor 121.

Here, when the threshold voltage of the organic EL element 127 is taken as VthEL, upon setting to "Vo−Vth<VthEL", the organic EL element 127 is set to a reverse bias state, and is in a cutoff state (high-impedance state), so emits no light, and also exhibits not diode property but simple capacity property. Accordingly, the drain current (driving current Ids) flowing to the driving transistor 121 is written in the capacitor "C=Cs+Cel" wherein both of the capacity value Cs of the storage capacitor 120 and the capacity value Cel of the parasitic capacitor (equivalent capacitor) Cel of the organic EL element 127 are combined. Thus, the drain current of the driving transistor 121 flows into the parasitic capacitor Cel, and charge is started. As a result thereof, the source potential Vs of the driving transistor 121 rises.

With the timing chart in FIG. 15B, this rise is represented with .DELTA.V. This rise, i.e., negative feedback amount .DELTA.V which is a mobility correction parameter, is to be subtracted from the voltage between the gate and source "Vgs=Vin+Vth" held in the storage capacitor 120 by threshold correction, and consequently, "Vgs=Vin−.DELTA.V+Vth" is to be held, which is equivalent to subjecting thereto negative feedback. At this time, the source potential Vs of the driving transistor 121 becomes the value "−Vth+.DELTA.V" obtained by subtracting "Vgs=Vin−.DELTA.V+Vth" held in the storage capacitor from the gate potential Vg(=Vin).

Thus, with the driving timing according to the pixel circuit P according to the second embodiment, at the sampling period and mobility correction period H (t16 through t17), sampling of the signal potential Vin, and adjustment of the negative feedback amount .DELTA.V for correcting the irregularities of the mobility .mu. are simultaneously performed. The write scanning unit 104 can adjust the time width of the sampling period and mobility correction period H by adjusting the ON/OFF period of the write driving pulse WS, and also can add a inclination to the change property of the picture signal Vsig, and accordingly, can optimize the negative feedback amount of the driving current Ids as to the storage capacitor 120.

Next, in a state in which the potential of the picture signal line 106HS is at the signal potential Vin, the write scanning unit 104 switches the write driving pulse WS to an inactive-low state (t17_1). Thus, the sampling transistor 125 goes to a non-electroconductive (OFF) state, the timing chart proceeds to a light-emitting period I. The horizontal driving unit 106 stops supply of the signal potential Vin of the picture signal Vsig to the picture signal line 106HS at a suitable time point thereafter, and returns the picture signal line 106HS to the reference potential Vo (t18_1). Subsequently, the stage proceeds to the next frame (or field), where the threshold correction preparation operation, threshold correction operation, mobility correction operation, and light-emitting operation are repeated again.

As a result thereof, the gate terminal G of the driving transistor 121 is isolated from the picture signal line 106HS. Applying of the signal potential Vin to the gate terminal G of the driving transistor 121 is cancelled, so the gate potential Vg of the driving transistor 121 can increase. At this time, the driving current Ids flowing to the driving transistor 121 flows to the organic EL element 127, and the anode potential of the organic EL element 127 increases according to the driving current Ids. This increase is assumed to be Vel. Eventually, the reverse bias state of the organic EL element 127 is cancelled along with increase of the source potential Vs, so the organic EL element 127 actually starts emitting of light according to inflow of the driving current Ids. The increase of the anode potential of the organic EL element 127 at this time (Vel) is exactly increase of the source potential Vs of the driving transistor 121, and the source potential Vs of the driving transistor 121 goes to "−Vth+.DELTA.V+Vel".

The relations between the driving current Ids and the gate voltage Vgs can be represented such as shown in the above-mentioned Expression (2), the term of the threshold voltage Vth is cancelled, and the driving current Ids supplied to the organic EL element 127 does not depend on the threshold voltage Vth of the driving transistor 121. The driving current Ids is basically determined with the signal potential Vin of the signal voltage Vsig. In other words, the organic EL element 127 emits light with the brightness corresponding to the signal potential Vin.

At this time, the signal potential Vin is corrected with the feedback amount .DELTA.V. This correction amount .DELTA.V serves so as to cancel the effects of the mobility .mu. positioned at the coefficient portion of Expression (2). Accordingly, the driving current Ids substantially depends on the signal potential Vin alone. The driving current Ids does not depend on the threshold voltage Vth, so even if the threshold voltage Vth changes due to manufacturing process, the driving current Ids between the drain and source does not fluctuate, and the light-emitting brightness of the organic EL element 127 does not fluctuate.

Also, the storage capacitor 120 is connected between the gate terminal G and source terminal S of the driving transistor 121, the bootstrap operation is performed at the beginning of the light-emitting period due to the effects by the storage capacitor 120 thereof, while the voltage Vgs between the gate and source of the driving transistor 121 is kept steady, the gate potential Vg and source potential Vs of the driving transistor 121 increase. The driving transistor 121 operates as a constant current source, so the I-V property of the organic EL element 127 changes over time, and even if the source potential Vs of the driving transistor 121 changes along therewith, the potential Vgs between the gate and source of the driving transistor 121 is kept steady (generally equal to Vin−.DELTA.V+Vth) by the storage capacitor 120, so the current flowing to the organic EL element 127 does not change, and accordingly, the light-emitting brightness of the organic EL element 127 is also kept steady. According to the bootstrap operation, even if the I-V property of the organic EL element 127 changes over time, image display having no brightness deterioration accompanied therewith can be realized.

Now, as can be understood from the above description, with the timing for driving the pixel circuit P according to the second embodiment, the active-high period of the write driving pulse WS serves as not only the sampling period of the picture signal Vsig (signal potential Vin) but also the mobility correction period. The irregularities of the active-high period thereof cause the irregularities of threshold correction effects and mobility correction effects similar to the first embodiment. Accordingly, similar the first embodiment, in order to prevent the waveform blunting of the write driving pulse WS supplied from the output circuit 400 of the write scanning unit 104 from fluctuating for each row, it is desirable to apply the same concept as one of the above-mentioned first through third embodiments of the improvement technique to the layout of the buffer transistors of the output circuit 400.

Description has been made so far regarding the present invention by way of embodiments, but the technical scope of the present invention is not restricted to the scope described in the above-mentioned embodiments. Various types of modification or improvement can be added to the above-mentioned embodiments without departing the scope of the present invention, and embodiments to which such modifications or improvements have been added are also encompassed in the technical scope of the present invention.

Also, the claimed invention is not restricted to the above-mentioned embodiments, and not all of the combinations of the features described in the embodiments are necessarily indispensable to carrying out the present invention. The inventions encompasses the above-mentioned embodiments in various stages, and various manifestations of the invention can be extracted with an appropriate combination of disclosed multiple components. Even if several components are eliminated from all the components shown in the embodiments, an arrangement from which the several components have been eliminated can be extracted as being within the scope of the invention, as long as an advantage thereof can be obtained.

For example, with the above-mentioned embodiments, in the driving timing example shown in FIG. 4, by taking into consideration the fact that the mobility correction period determined with the phase difference between the write driving pulse WS and scan driving pulse NDS is absolutely short, and the irregularities of the pulse timing thereof (ON/OFF timing or change property) greatly affect the property of the mobility correction, layout examples have been described whereby the property irregularities of the output circuits 400 and 500 for outputting the write driving pulse WS and scan driving pulse NDS to be supplied to each of the scanning lines 104WS and 105DS can be reduced, but the same concept can be applied to driving pulses employed for other function purposes.

Also, with the above-mentioned embodiments, description has been made specifically regarding layout examples of the buffer transistors in the case of the driving system for realizing threshold correction and mobility correction using the respective pixel circuits having a five-transistor configuration or two-transistor configuration, but as for other pixel circuits to which the driving system for realizing threshold correction and mobility correction can be applied, in addition to those, pixel circuits can be conceived, which have a four-transistor configuration or three-transistor configuration which are positioned between the five-transistor through two-transistor. In these cases as well, the arrangement can also be applied wherein the sizes of buffer transistors for determining an operation period are set identically to or more greatly than the pixel pitch in the scanning direction of a laser beam.

Also, with the above-mentioned layout example wherein the buffer transistors of which the sizes are set identically to or more greatly than the pixel pitch in the scanning direction of a laser beam are disposed in a column in the longitudinal direction of laser beam irradiation, the buffer transistors to be processed have been transistors for the vertical scanning system according to threshold correction and mobility correction, but may be transistors for the horizontal scanning system. In either event, of the buffer transistors for outputting a pulse signal for sampling an input video signal to each signal line, it is desirable to select buffer transistors necessary for aligning the levels of the property irregularities of driving pulse waveforms.

It should be understood by those skilled in the art that various modifications, combinations, sub-combinations and alterations may occur depending on design requirements and other factors insofar as they are within the scope of the appended claims or the equivalents thereof.

What is claimed is:

1. A display device comprising:
    a plurality of pixel circuits disposed in a matrix; and
    a scanner circuit including an output stage that includes at least one pair of buffer transistors, a respective pair of the at least one pair of buffer transistors being configured to output a pulse signal for driving the pixel circuits in a respective row of the matrix via a signal line extending in a row direction of the matrix directly from a node between corresponding buffer transistors of the respective pair;
    wherein each of the pixel circuits includes:
        a storage capacitor configured to store a voltage corresponding to an image signal;
        a sampling transistor configured to sample the image signal; and
        a driving transistor configured to control a driving current for a light emitting element based on the voltage stored in the storage capacitor,
    wherein a part of a polysilicon layer corresponding to the pixel circuits and the scanner circuit are formed with laser beam irradiation scanned in the row direction or a column direction of the matrix; and
    wherein the buffer transistor characteristics for each of the buffer transistors is dependent upon radiation received during at least four separated independent laser radiation application steps,
    and further wherein a part of the polysilicon layer corresponding to each of the buffer transistors includes a portion which is protruding from an area corresponding to one pixel row in the column direction.

2. The display device according to claim 1, wherein a size of the part of the polysilicon layer corresponding to each of the buffer transistors is substantially equal to a pixel pitch in the column direction.

3. The display device according to claim 1, wherein a size of the part of the polysilicon layer corresponding to each of the buffer transistors is greater than a pixel pitch in the column direction.

4. The display device according to claim 1, wherein a channel width of at least one of the buffer transistors is substantially equal to a pixel pitch in the column direction.

5. The display device according to claim 1, wherein a channel width of at least one of the buffer transistors is greater than a pixel pitch in the column direction.

6. The display device according to claim 1, wherein the part of the polysilicon layer corresponding to the pixel circuits and the scanner circuit is formed with laser beam irradiation scanned in the column direction.

7. The display device according to claim 1, wherein each of said buffer transistors of each row has a multi-finger configuration.

8. The display device according to claim 7, wherein each size of the respective transistors having a multi-finger configuration is equal to or greater than the pixel pitch in the scanning direction of said laser beam.

9. The display device according to claim 1, wherein each of the pixel circuits further includes a switch transistor configured to switch the driving current for the light emitting element,
and wherein each of the buffer transistors is configured to output the pulse signal to the switch transistor in each of the pixel circuits in a respective row of the matrix.

10. The display device according to claim 1, wherein each of the buffer transistors is configured to output the pulse signal to the sampling transistor in each of the pixel circuits in a respective row of the matrix.

11. A method of manufacturing a display device, comprising:
providing a substrate,
forming a silicon layer corresponding to a scanner and a plurality of pixel circuits formed in a matrix on the substrate,
scanning laser beam irradiation in a row direction or a column direction of the matrix so as to apply laser radiation pulses to the silicon layer, thereby forming a polysilicon layer,
wherein the scanner circuit including an output stage that includes at least one pair of buffer transistors, a respective pair of the at least one pair of buffer transistors being configured to output a control signal for driving the pixel circuits in a respective row of the matrix via a signal line extending in the row direction directly from a node between corresponding buffer transistors of the respective pair, and
further wherein said scanning laser beam irradiation includes radiating at least four laser beam pulses to a part of the silicon layer corresponding to each of the buffer transistors, the buffer transistor characteristics being dependent on said at least four laser beam pulses, and the part of the silicon layer including a portion which protrudes from an area corresponding to one pixel row in the column direction.

12. The method according to claim 11, wherein each of the pixel circuits includes:
a storage capacitor configured to store a voltage corresponding to an image signal;
a sampling transistor configured to sample the image signal; and
a driving transistor configured to control a driving current for a light emitting element based on the voltage stored in the storage capacitor.

13. The method according to claim 12, wherein a size of the part of the polysilicon layer corresponding to at least one of the buffer transistors is substantially equal to a pixel pitch in the column direction.

14. The method according to claim 12, wherein a size of the part of the polysilicon layer corresponding to at least one of the buffer transistors is greater than a pixel pitch in the column direction.

15. The method according to claim 12, wherein a channel width of at least one of the buffer transistors is substantially equal to a pixel pitch in the column direction.

16. The method according to claim 12, wherein a channel width of at least one of the buffer transistors is greater than a pixel pitch in the column direction.

17. The method according to claim 12, wherein a direction of said scanning laser beam irradiation is the column direction.

18. The method according to claim 12, wherein each of said buffer transistors of each row has a multi-finger configuration.

19. The method according to claim 18, wherein each size of the respective transistors having a multi-finger configuration is equal to or greater than the pixel pitch in the scanning direction of said laser beam.

20. The method according to claim 12, wherein each of the pixel circuits further includes a switch transistor configured to switch the driving current for the light emitting element, and wherein each of the buffer transistors is configured to output the pulse signal to the switch transistor in each of the pixel circuits in a respective row of the matrix.

21. The method according to claim 12, wherein each of the buffer transistors is configured to output the pulse signal to the sampling transistor in each of the pixel circuits in a respective row of the matrix.

* * * * *